(12) United States Patent
Fan et al.

(10) Patent No.: US 12,108,530 B2
(45) Date of Patent: Oct. 1, 2024

(54) CIRCUIT BOARD STRUCTURE AND MANUFACTURING METHOD THEREOF

(71) Applicant: Unimicron Technology Corp., Taoyuan (TW)

(72) Inventors: Kuang-Ching Fan, Taoyuan (TW); Chih-Peng Hsieh, Taoyuan (TW); Cheng-Hsiung Wang, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 38 days.

(21) Appl. No.: 17/899,583

(22) Filed: Aug. 30, 2022

(65) Prior Publication Data

US 2023/0225050 A1    Jul. 13, 2023

Related U.S. Application Data

(60) Provisional application No. 63/299,014, filed on Jan. 13, 2022, provisional application No. 63/299,015, filed on Jan. 13, 2022.

(30) Foreign Application Priority Data

Jul. 22, 2022   (TW) ................................. 111127643

(51) Int. Cl.
*H05K 1/11* (2006.01)
*H05K 1/02* (2006.01)
*H05K 3/46* (2006.01)

(52) U.S. Cl.
CPC .......... *H05K 1/112* (2013.01); *H05K 3/4644* (2013.01); *H05K 1/0284* (2013.01); *H05K 1/0298* (2013.01); *H05K 1/113* (2013.01); *H05K 2201/098* (2013.01)

(58) Field of Classification Search
CPC ...... H05K 1/112; H05K 3/4644; H05K 1/113; H05K 2201/0367; H05K 2201/098; H05K 2201/09836; H01L 23/5383; H01L 23/5384; H01L 23/5386
See application file for complete search history.

(56) References Cited

U.S. PATENT DOCUMENTS

| | | | |
|---|---|---|---|
| 9,875,957 B2 | 1/2018 | Shimizu et al. | |
| 2015/0245473 A1* | 8/2015 | Shimizu | H05K 1/113 29/850 |
| 2015/0357276 A1* | 12/2015 | Shimizu | H01L 23/49827 361/783 |
| 2019/0109085 A1* | 4/2019 | Sakamoto | H01L 23/49827 |
| 2021/0045238 A1* | 2/2021 | Kunikane | H05K 1/115 |

* cited by examiner

Primary Examiner — Ishwarbhai B Patel
(74) Attorney, Agent, or Firm — JCIPRNET

(57) ABSTRACT

A circuit board structure includes a circuit substrate, a first circuit layer, and a second circuit layer. The circuit substrate has a surface and includes at least one conductive structure and at least one patterned circuit layer. The conductive structure is electrically connected to the patterned circuit layer, and an upper surface of the conductive structure is aligned with the surface. The first circuit layer is directly disposed on the surface of the circuit substrate and electrically connected to the conductive structure. A line width of the first circuit layer is less than or equal to ¼ of a line width of the patterned circuit layer. The second circuit layer is directly disposed on the first circuit layer and electrically connected to the first circuit layer.

4 Claims, 25 Drawing Sheets

CIRCUIT BOARD STRUCTURE AND MANUFACTURING METHOD THEREOF

CROSS-REFERENCE TO RELATED APPLICATION

This application claims the priority benefit of U.S. provisional application Ser. No. 63/299,014, filed on Jan. 13, 2022, U.S. provisional application Ser. No. 63/299,015, filed on Jan. 13, 2022, and Taiwan application Ser. No. 111127643, filed on Jul. 22, 2022. The entirety of each of the above-mentioned patent applications is hereby incorporated by reference herein and made a part of this specification.

BACKGROUND

Technology Field

The disclosure relates to a substrate structure and a manufacturing method thereof, and particularly, to a circuit board structure and a manufacturing method thereof.

Description of Related Art

High-density interconnect (HDI) substrates come with advantages, such as small size, high speed, and high frequency. These substrates have been a main component of personal computers, portable computers, mobile phones, and personal digital assistants. Generally, the bonding of thin-film redistribution layers and HDI substrates requires the formation of a transition layer before forming a circuit layer with a fine line width. Because of the requirement of the transition layer, the process complexity is increased, and a transmission path is added to the signal transmission, thereby reducing the signal integrity. In addition, the uppermost layer of the HDI substrate is mostly manufactured by the subtractive method, and the limit to processing the circuits of the transition layer is the ratio of 0.8 between line width and copper thickness. As the current market trend is in pursuit of thin line width, the copper thickness can only be 12.5 microns when the required line width is limited to 10 microns, and when this is applied to the multi-layer organic (MLO) carrier board used at the test end of the probe card, there is a risk of line melting due to a small cross-sectional area of the line and the large resistance. In addition, if a connection layer formed by soldering and filled with colloid is used to connect the redistribution layer (RLD) and the HDI substrate, the problem of poor coplanarity occurs after bonding.

SUMMARY

The disclosure provides a circuit board structure capable of shortening the signal transmission path and have favorable signal integrity.

The disclosure provides a manufacturing method of a circuit board structure for manufacturing the circuit board structure.

The circuit board structure of the disclosure includes a circuit substrate, a first circuit layer, and a second circuit layer. The circuit substrate has a surface and includes at least one conductive structure and at least one patterned circuit layer. The conductive structure is electrically connected to the patterned circuit layer, and an upper surface of the conductive structure is aligned with the surface. The first circuit layer is directly disposed on the surface of the circuit substrate and electrically connected to the conductive structure. A line width of the first circuit layer is less than or equal to ¼ of a line width of the patterned circuit. The second circuit layer is directly disposed on the first circuit layer and electrically connected to the first circuit layer.

In an embodiment of the disclosure, the circuit substrate comprises a high-density interconnect (HDI) substrate.

In an embodiment of the disclosure, the first circuit layer includes at least one circuit. The circuit has an aspect ratio as a thickness of the at least one circuit over its line width greater than or equal to 2.5.

In an embodiment of the disclosure, the line width and line spacing of the circuit are respectively less than or equal to 10 microns.

In an embodiment of the disclosure, the first circuit layer includes at least one pad, and a diameter of the pad is less than or equal to ⅕ of a diameter of the conductive structure.

The manufacturing method of the circuit board structure of the disclosure includes steps as follows. A circuit substrate is provided. The circuit substrate has a surface and includes at least one conductive structure and at least one patterned circuit layer. The conductive structure is electrically connected to the at least one patterned circuit layer, and an upper surface of the conductive structure is aligned with the surface. A first circuit layer is formed on the surface of the circuit substrate. The first circuit layer is in direct contact with the surface and electrically connected to the conductive structure, and a line width of the first circuit layer is less than or equal to ¼ of a line width of the patterned circuit. A second circuit layer is formed on the first circuit layer. The second circuit layer is in direct contacts with the first circuit layer and electrically connected to the first circuit layer.

In an embodiment of the disclosure, the step of forming the first circuit layer on the surface of the circuit substrate includes steps as follows. A seed layer is formed on the surface of the circuit substrate. A patterned photoresist layer is formed on the seed layer. The patterned photoresist layer is adopted as an electroplating mask, and a conductive material is electroplated on the seed layer. The patterned photoresist layer and part of the seed layer thereunder are removed to form the first circuit layer.

In an embodiment of the disclosure, the step of when the circuit substrate is provided, covering the surface and the conductive structure by a copper foil layer to form the first circuit layer on the surface of the circuit substrate includes steps as follows. A patterned photoresist layer is formed on the copper foil layer. The copper foil layer exposed outside the patterned photoresist layer is etched to expose part of the surface of the circuit substrate. The patterned photoresist layer is removed to form the first circuit layer on the surface of the circuit substrate.

In an embodiment of the disclosure, the step of when the circuit substrate is provided, covering the surface and the at least one conductive structure by a copper foil layer to form the first circuit layer on the surface of the circuit substrate includes a step of performing a laser process on the copper foil layer to form the first circuit layer on the surface of the circuit substrate.

In an embodiment of the disclosure, the circuit substrate includes a high-density interconnect (HDI) substrate.

In summary, in the design of the circuit board structure of the disclosure, the first circuit layer is directly disposed on the surface of the circuit substrate and electrically connected to the conductive structure of the circuit substrate, and the line width of the first circuit layer is less than or equal to ¼ of the line width of the patterned circuit layers of the circuit substrate. That is, in the circuit board structure of the disclosure, without configuring the transfer layer in the prior art, a first circuit layer with a thin line width can be directly formed on the circuit substrate, which can effectively shorten the signal transmission path and has favorable signal integrity.

In order to make the features and advantages of the disclosure comprehensible, embodiments accompanied with drawings are described in detail below.

DESCRIPTION OF THE EMBODIMENTS

Figure 1A:
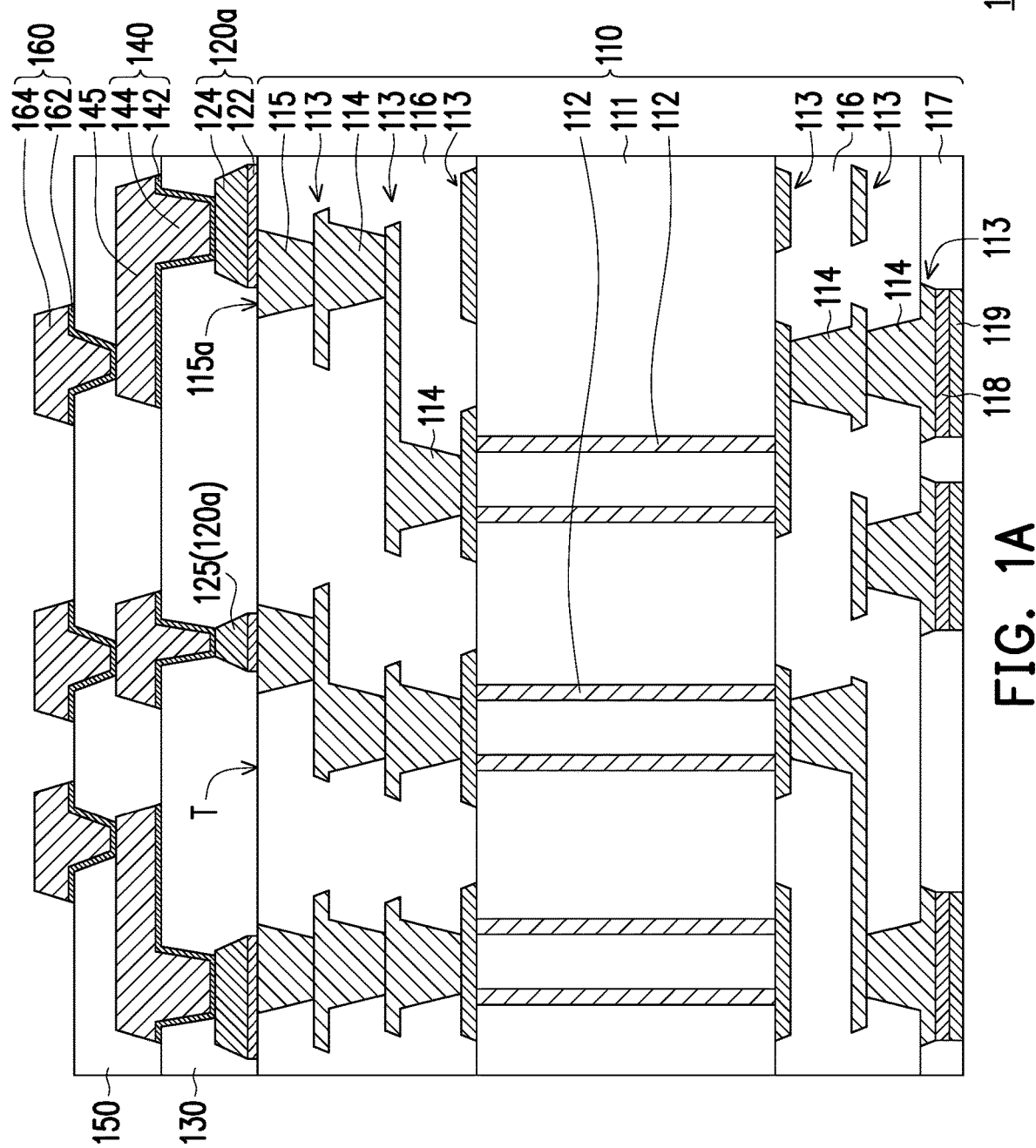
FIG. 1A is a schematic cross-sectional view of a circuit board structure according to an embodiment of the disclosure.
Figure 1B:
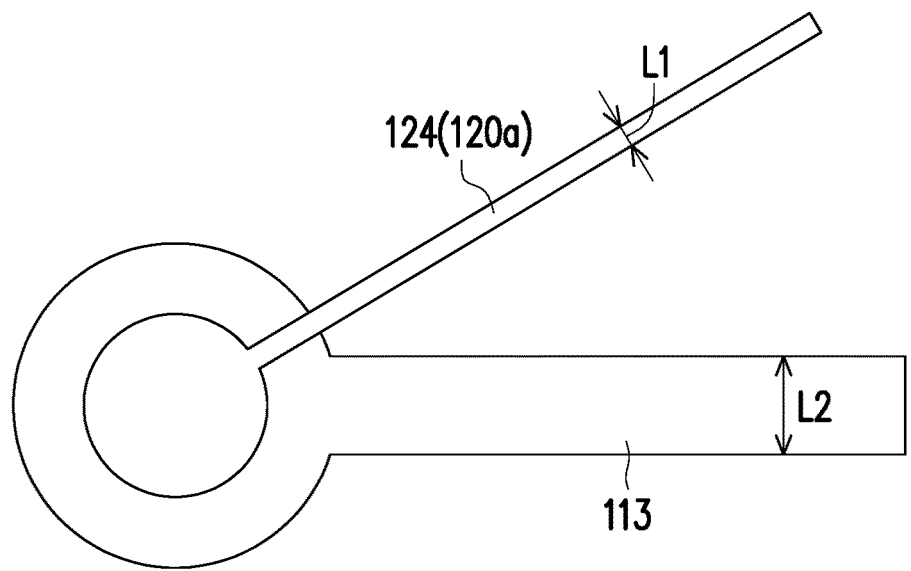
FIG. 1B is a top schematic view of part of the patterned circuit layer and the circuits of the first circuit layer of the circuit substrate of the circuit board structure of FIG. 1A.
Figure 1C:
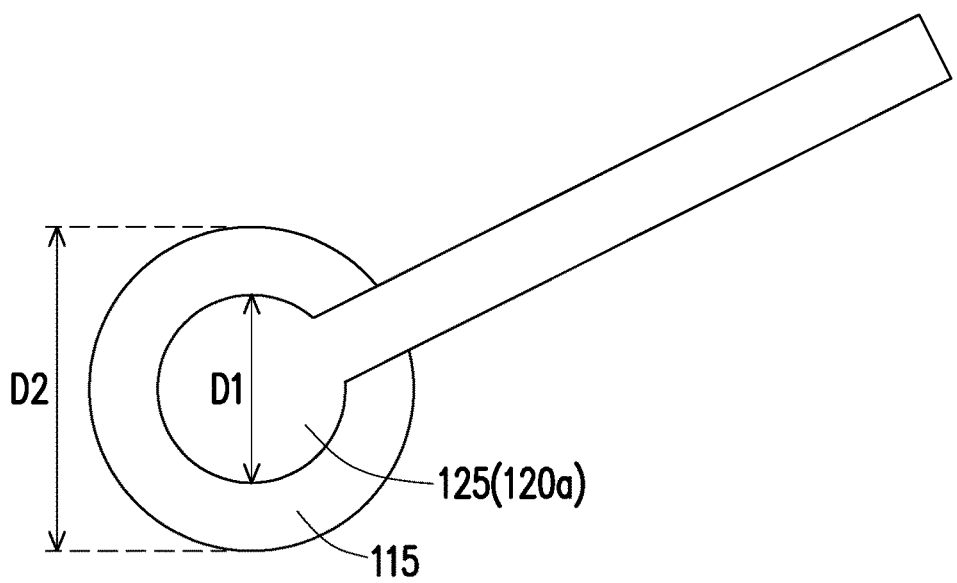
FIG. 1C is a top schematic view of the conductive structure of the circuit substrate and the pads of the first circuit layer of the circuit board structure of FIG. 1A.

FIG. 1A is a schematic cross-sectional view of a circuit board structure according to an embodiment of the disclosure. FIG. 1B is a top schematic view of part of the patterned circuit layer and the circuits of the first circuit layer of the circuit substrate of the circuit board structure of FIG. 1A. FIG. 1C is a top schematic view of the conductive structure of the circuit substrate and the pads of the first circuit layer of the circuit board structure of FIG. 1A. Referring to FIG. 1A first, in the embodiment, a circuit board structure 100a includes a circuit substrate 110, a first circuit layer 120a, and a second circuit layer 140. The circuit substrate 110 has a surface T and includes at least one conductive structure 115 (multiple conductive structures are schematically shown) and at least one patterned circuit layer 113 (multiple patterned circuit layers are schematically shown). The conductive structure 115 is electrically connected to the patterned circuit layer 113, and an upper surface 115a of the conductive structure 115 is aligned with the surface T of the circuit substrate 110. The first circuit layer 120a is directly disposed on the surface T of the circuit substrate 110 and electrically connected to the conductive structure 115. The line width of the first circuit layer 120a is less than or equal to ¼ of the line width of the patterned circuit layer 113. The second circuit layer 140 is directly disposed on the first circuit layer 120a and electrically connected to the first circuit layer 120a.

In the embodiment, the circuit substrate 110 is a high-density interconnect (HDI) substrate, for example. Specifically, the circuit substrate 110 includes a core layer 111, multiple conductive vias 112 penetrating the core layer 111 and separated from one another, patterned circuit layers 113 connected to opposite ends of the conductive vias 112 and alternately arranged with multiple dielectric layers 116, and a conductive structure 114 connecting two adjacent patterned circuit layers. The patterned circuit layer 113, the dielectric layer 116, and the conductive structure 114 may define a build-up circuit structure, which is disposed on opposite sides of the core layer 111, respectively. That is, the circuit board 110 is a high-density double-sided circuit board. One side of the core layer 111 includes the conductive structure 115, the conductive structure 115 is electrically connected to the patterned circuit layer 113, and a surface 115a of the conductive structure 115 is aligned with the surface T of the circuit substrate 110. Meanwhile, the surface T of the circuit substrate 110 and the surface 115a of the conductive structure 115 may define a connection plane for being structurally and electrically connected to the first circuit layer 120a. Another side of the core layer 111 further includes a solder mask layer 117 and a surface treatment layer, the solder mask layer 117 covers the surface of the dielectric layer 116 and exposes the patterned circuit layer 113, and the surface treatment layer is disposed on the patterned circuit layer 113 exposed by the solder mask layer 117. Meanwhile, the surface treatment layer includes a first metal layer 118 and a second metal layer 119 disposed on the first metal layer 118. The material of the first metal layer 118 and the material of the second metal layer 119 are, for example, nickel, gold, silver, nickel-palladium-gold, other suitable metal, or alloys, which can protect the patterned circuit layer 113 from oxidation.

Referring to FIG. 1A, FIG. 1B, and FIG. 1C altogether, in the embodiment, the first circuit layer 120a includes at least one circuit 124. Specifically, the aspect ratio as the thickness of the circuit 124 over its line width is greater than or equal to 2.5, for example, that is, it has a higher aspect ratio. In one embodiment, the line width of the circuit 124 is L1, and the line width of the patterned circuit layer 113 is L2. The line width L1 and the line spacing of the circuits 124 are, for example, less than or equal to 10 μm, respectively, and the line width L2 and the line spacing of the patterned circuit layer 113 are, for example, 40 μm, respectively. Furthermore, in the embodiment, the first circuit layer 120a further includes at least one pad 125. Specifically, the diameter D1 of the pad 125 is, for example, less than or equal to ⅕ of the diameter D2 of the conductive structure 115. Meanwhile, the diameter D1 of the pad 125 is, for example, less than 50 microns, which can increase the wiring area of the first circuit layer 120a. Due to the manufacturing process, the first circuit layer 120a in the embodiment further includes a seed layer 122, the seed layer 122 is located below the circuit 124 and the pad 125, and the seed layer 122 is configured to be directly connected to and correspond to the circuit 124 and the pad 125.

In addition, referring to FIG. 1A again, the circuit board structure 100a of the embodiment may further include an insulating layer 130, an insulating layer 150, a third circuit layer 145, and a fourth circuit layer 160. The insulating layer 130 covers the first circuit layer 120a, and the second circuit layer 140 is embedded in the insulating layer 150 and electrically connected to the first circuit layer 120a. The second circuit layer 140 includes a conductive pattern 144 and a seed layer 142 below the conductive pattern 144. The third circuit layer 145 and the second circuit layer 140 are electrically connected, and the third circuit layer 145 and the second circuit layer 140 are formed by the same process, so they are seamlessly connected to each other. The insulating layer 150 covers the third circuit layer 145, and the fourth circuit layer 160 is disposed on the insulating layer 150 and penetrates through the insulating layer 150 to be electrically connected to the third circuit layer 145. The fourth circuit layer 160 includes a conductive pattern 164 and a seed layer 162 below the conductive pattern 164.

The circuit board structure 100a of the embodiment has a four-layer circuit structure on the circuit substrate 110. Compared to the five-layer circuit structure in the prior art due to the additional transfer layer, the number of layers of the circuit board structure 100a in the embodiment can be reduced, so as to effectively shorten the signal transmission path and have favorable signal integrity. Furthermore, the first circuit layer 120a is directly disposed on the surface T of the circuit substrate 110 and electrically connected to the conductive structure 115 of the circuit substrate 110, and the line width of the first circuit layer 120a is less than or equal to ¼ of the line width of the patterned circuit layer 113 of the circuit substrate 110. That is, the circuit board structure 100a of the embodiment can directly form the first circuit layer 120a with a thin line width on the circuit substrate 110, which can increase the wiring area and reduce the number of wiring layers. In addition, since the connection layer formed by soldering and filling colloid in the prior art is not adopted in the embodiment, the circuit board structure 100a of the embodiment can have favorable coplanarity.

Figure 2A:
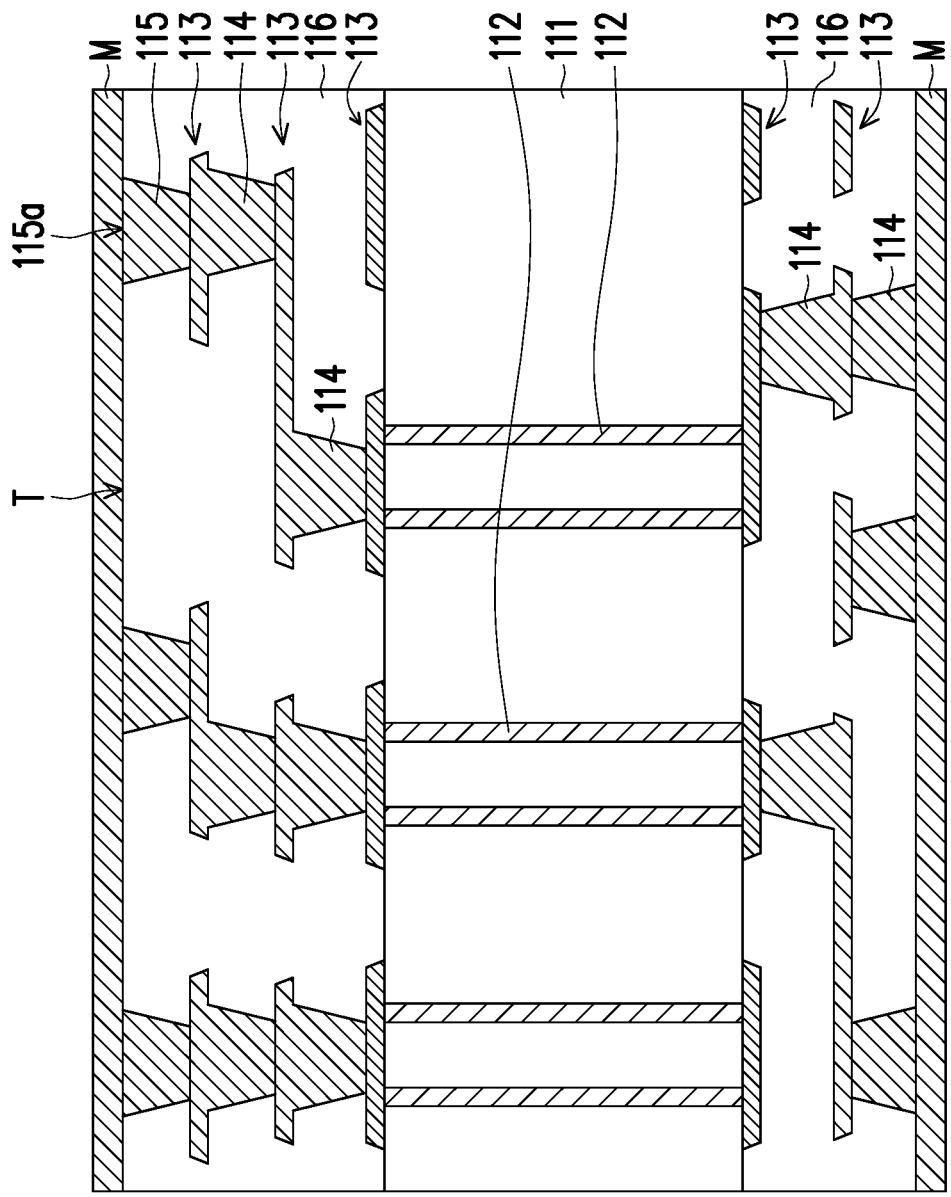
FIG. 2A to FIG. 2Q are schematic cross-sectional views for a manufacturing method of the circuit board structure of FIG. 1.
Figure 2B:
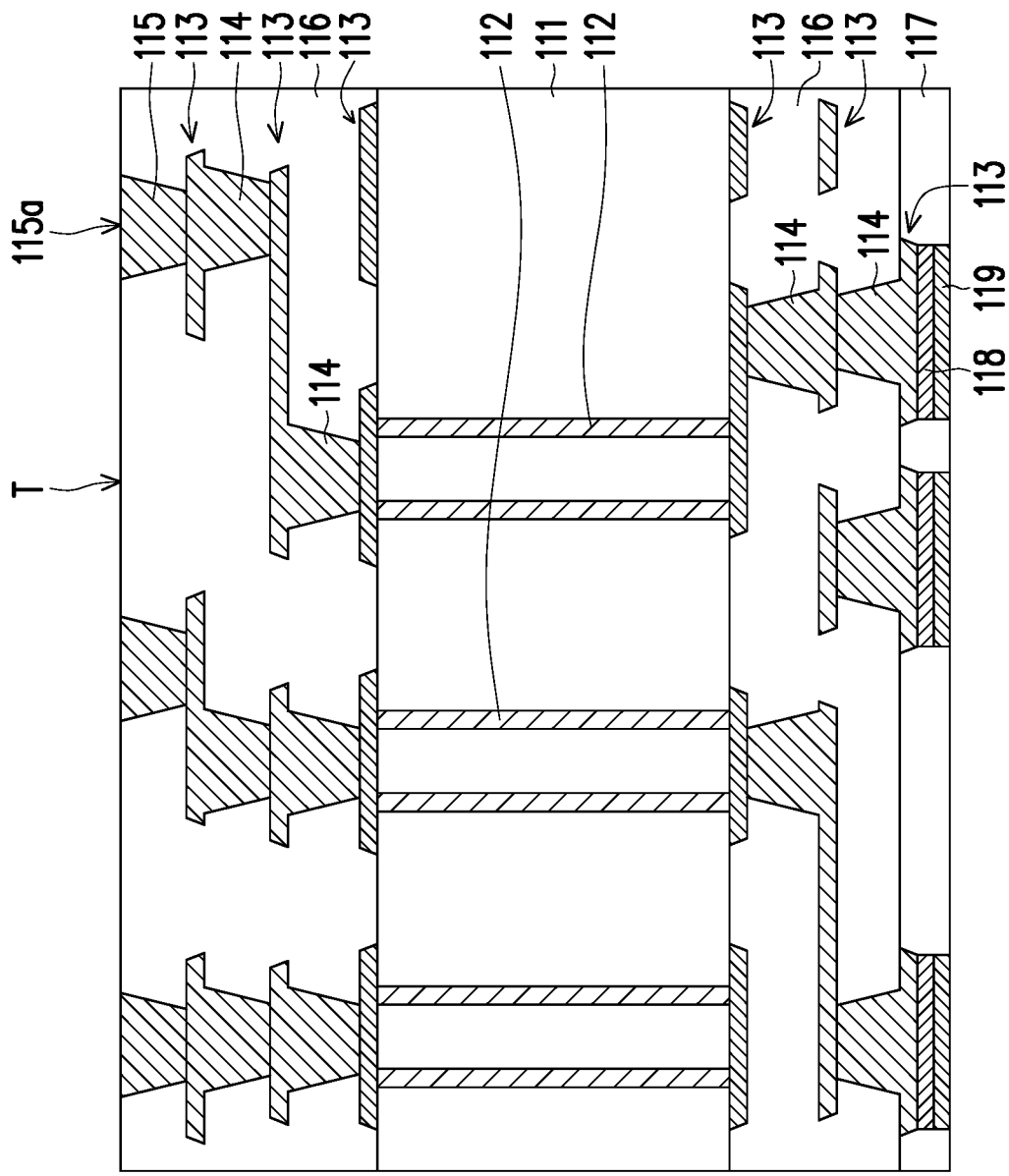
Figure 2C:
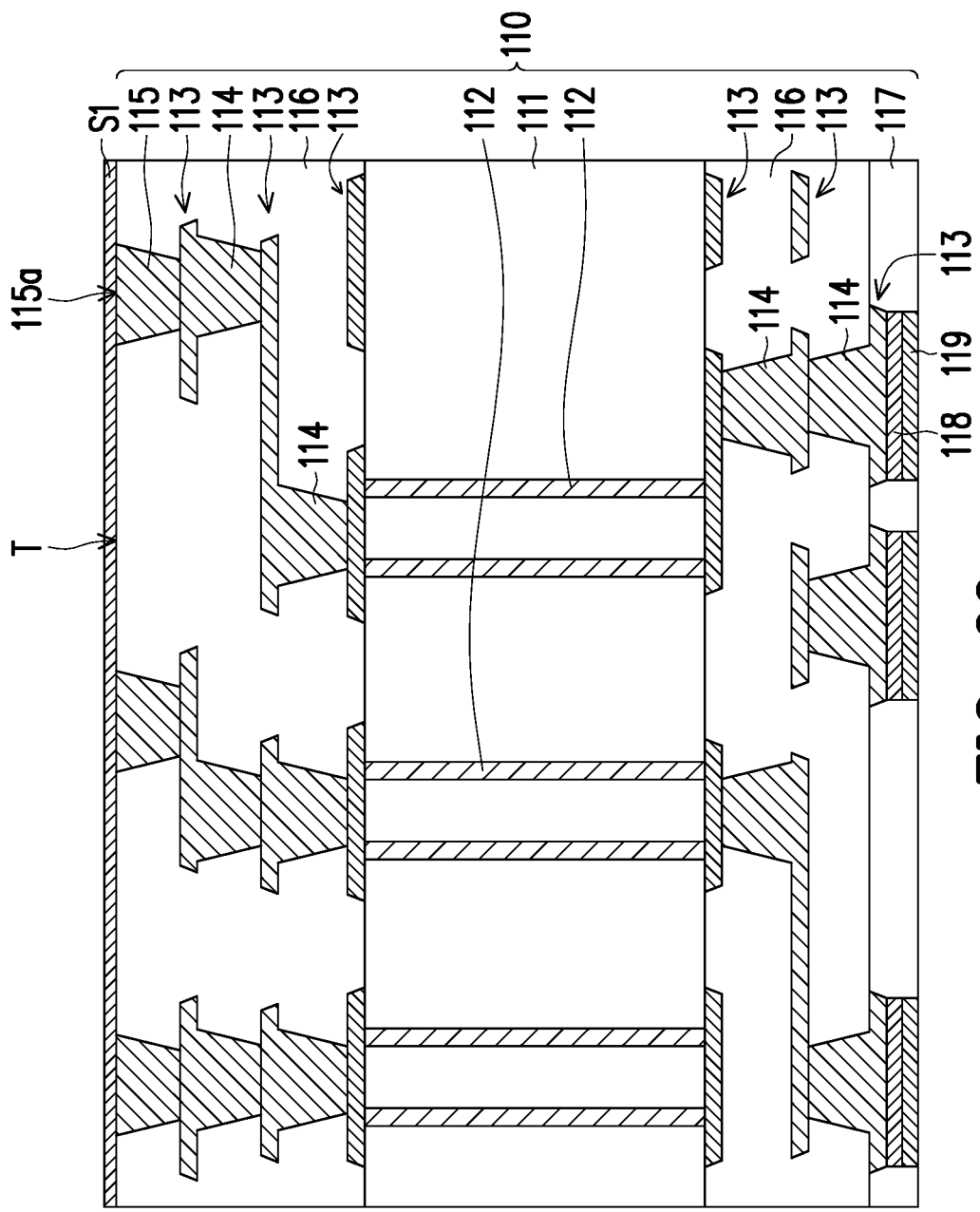
Figure 2D:
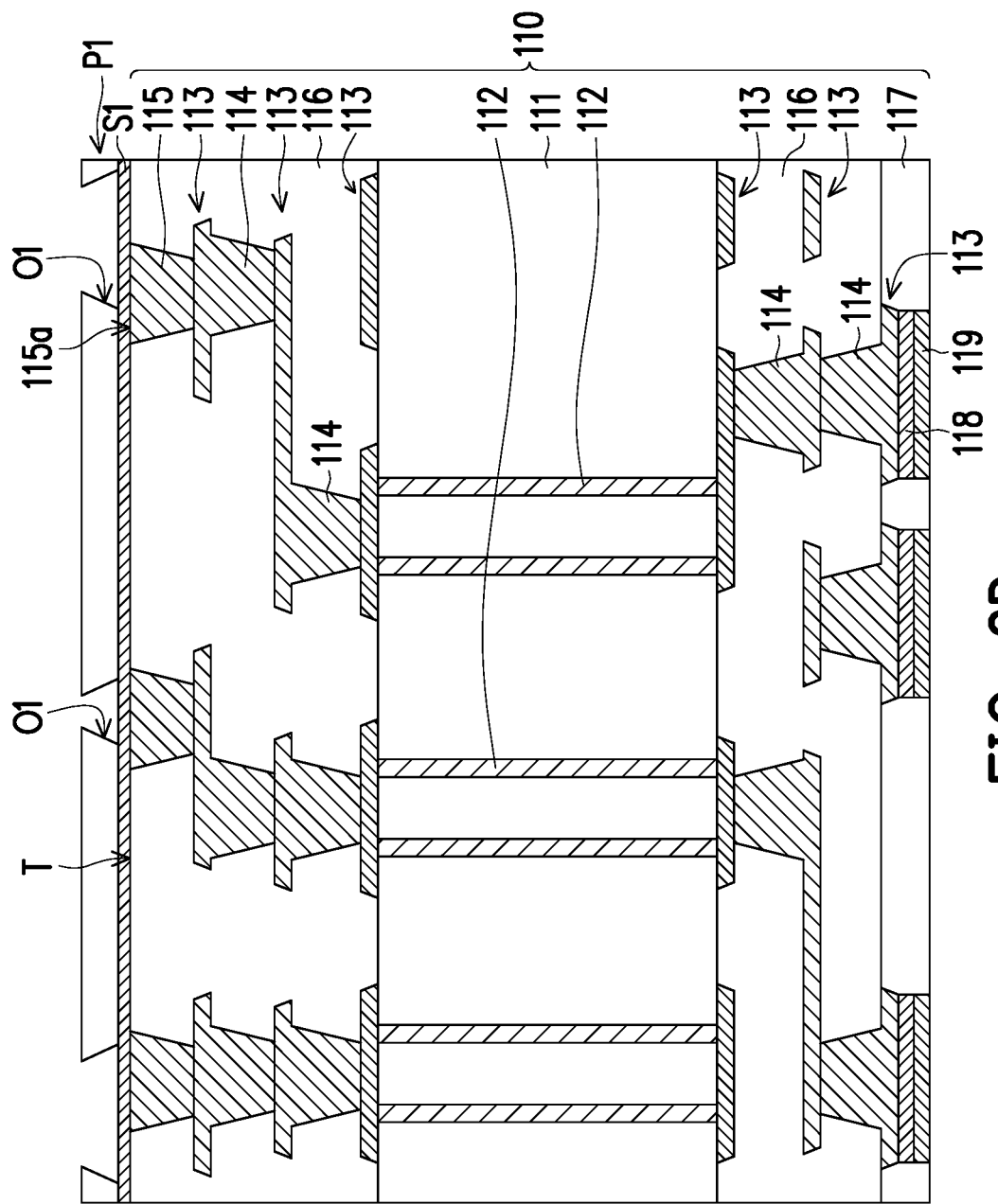
Figure 2E:
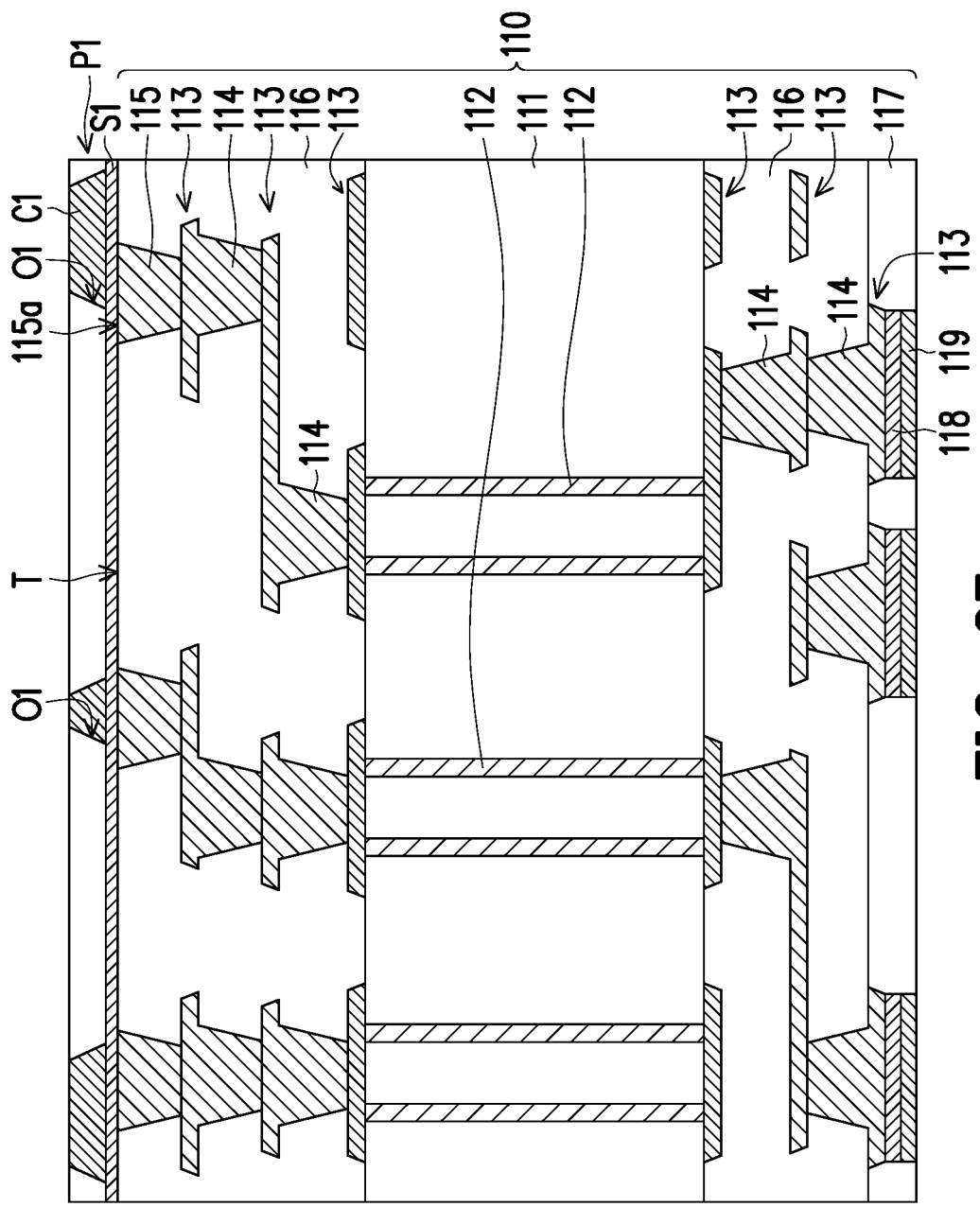
Figure 2F:
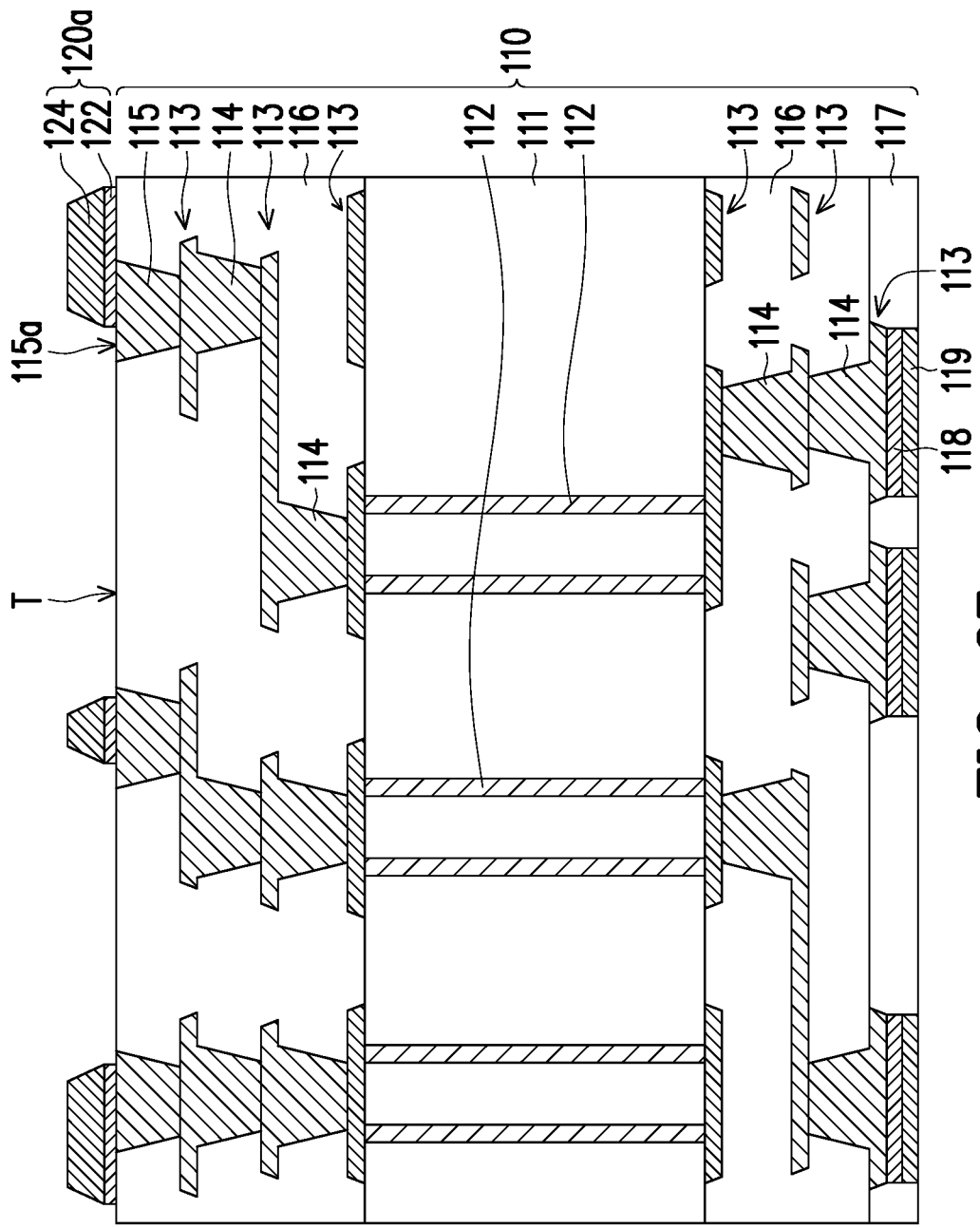
Figure 2G:
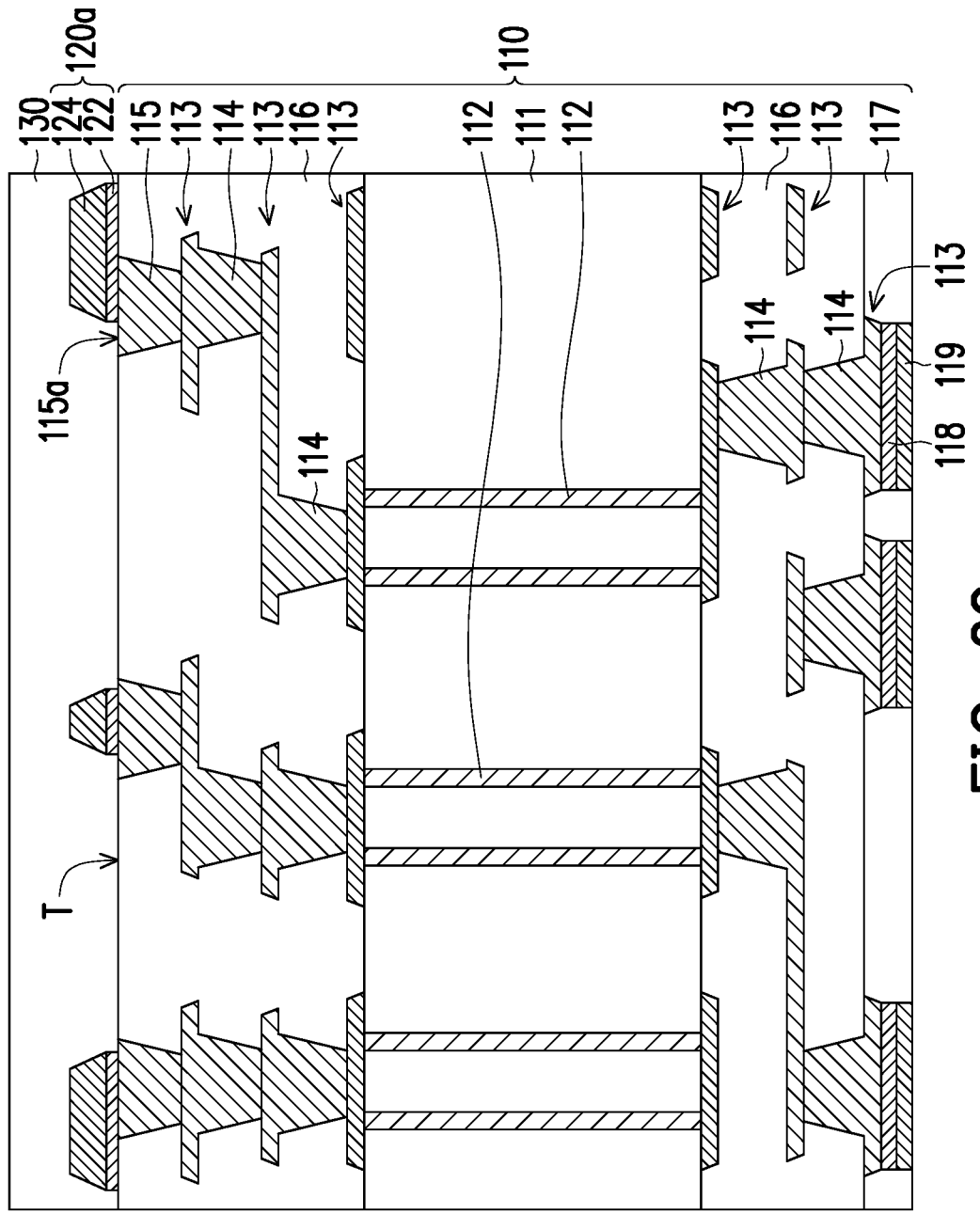
Figure 2H:
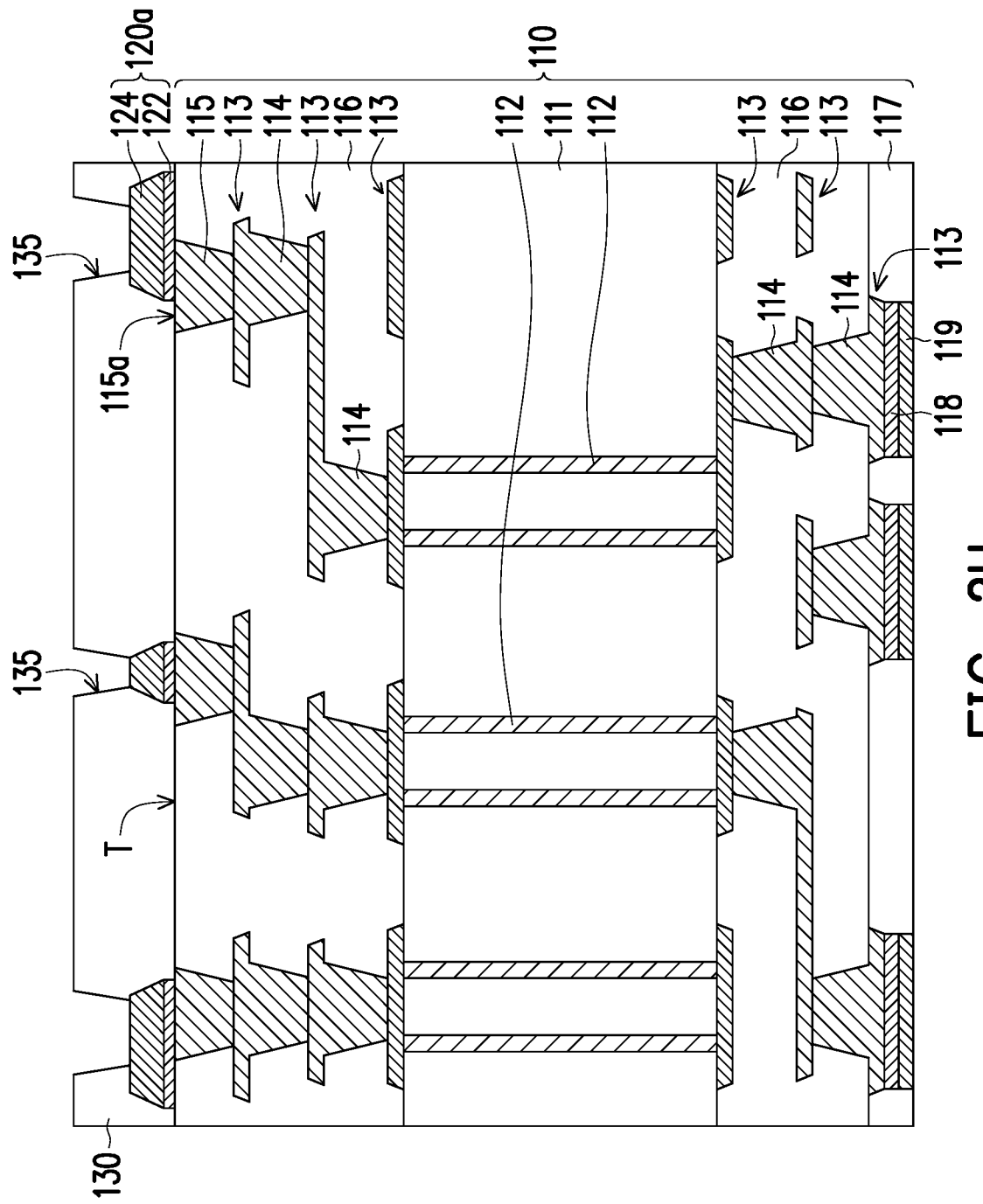
Figure 2I:
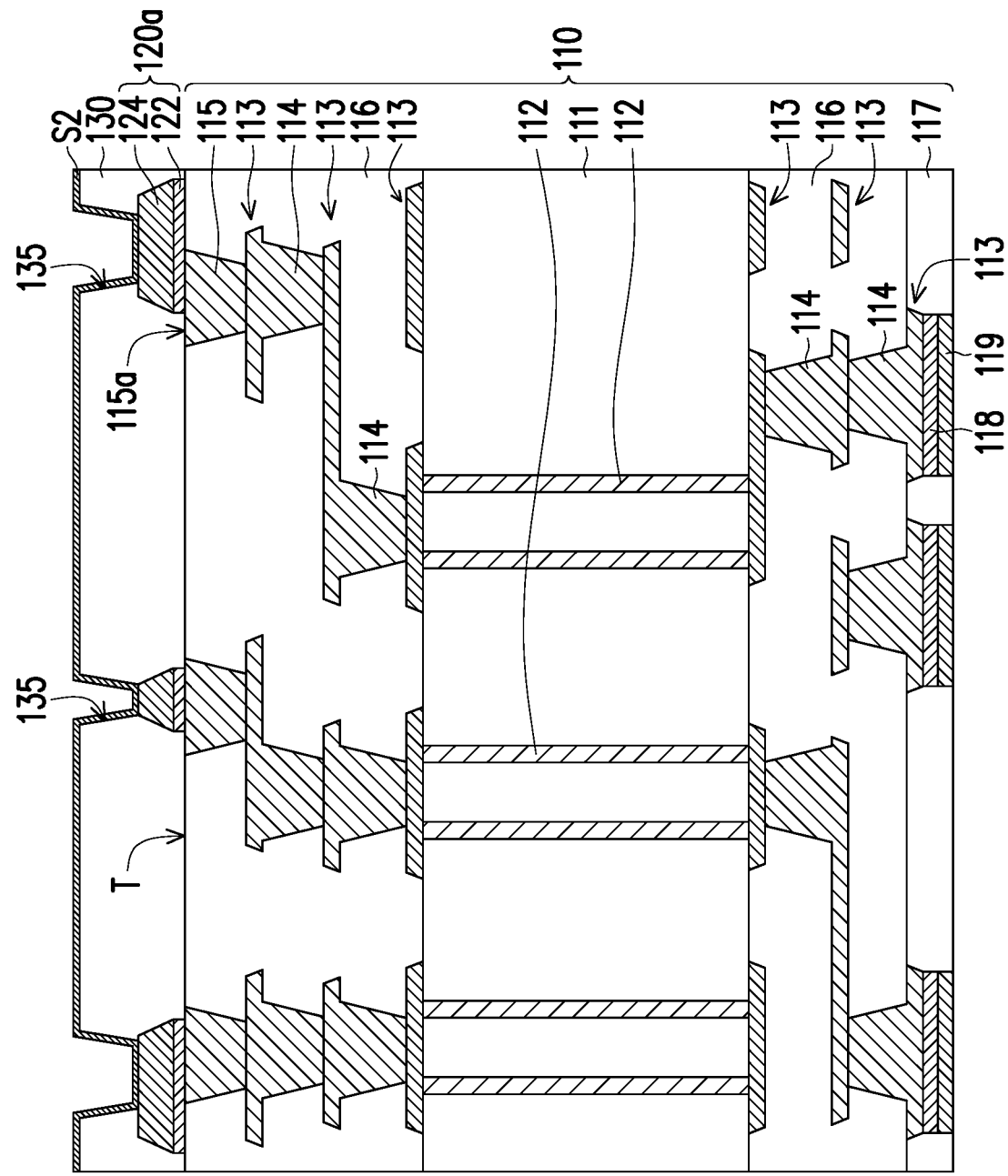
Figure 2J:
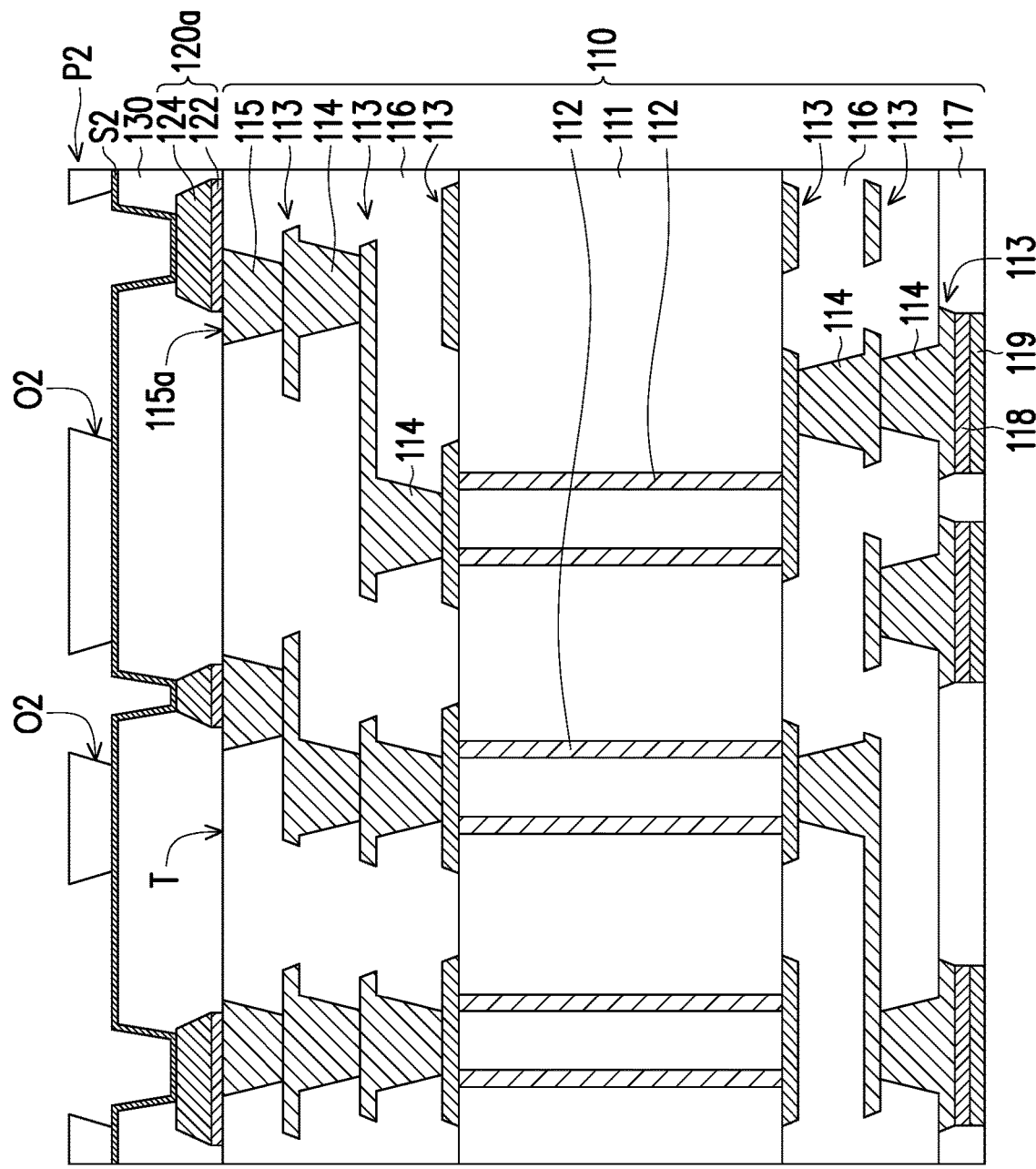
Figure 2K:
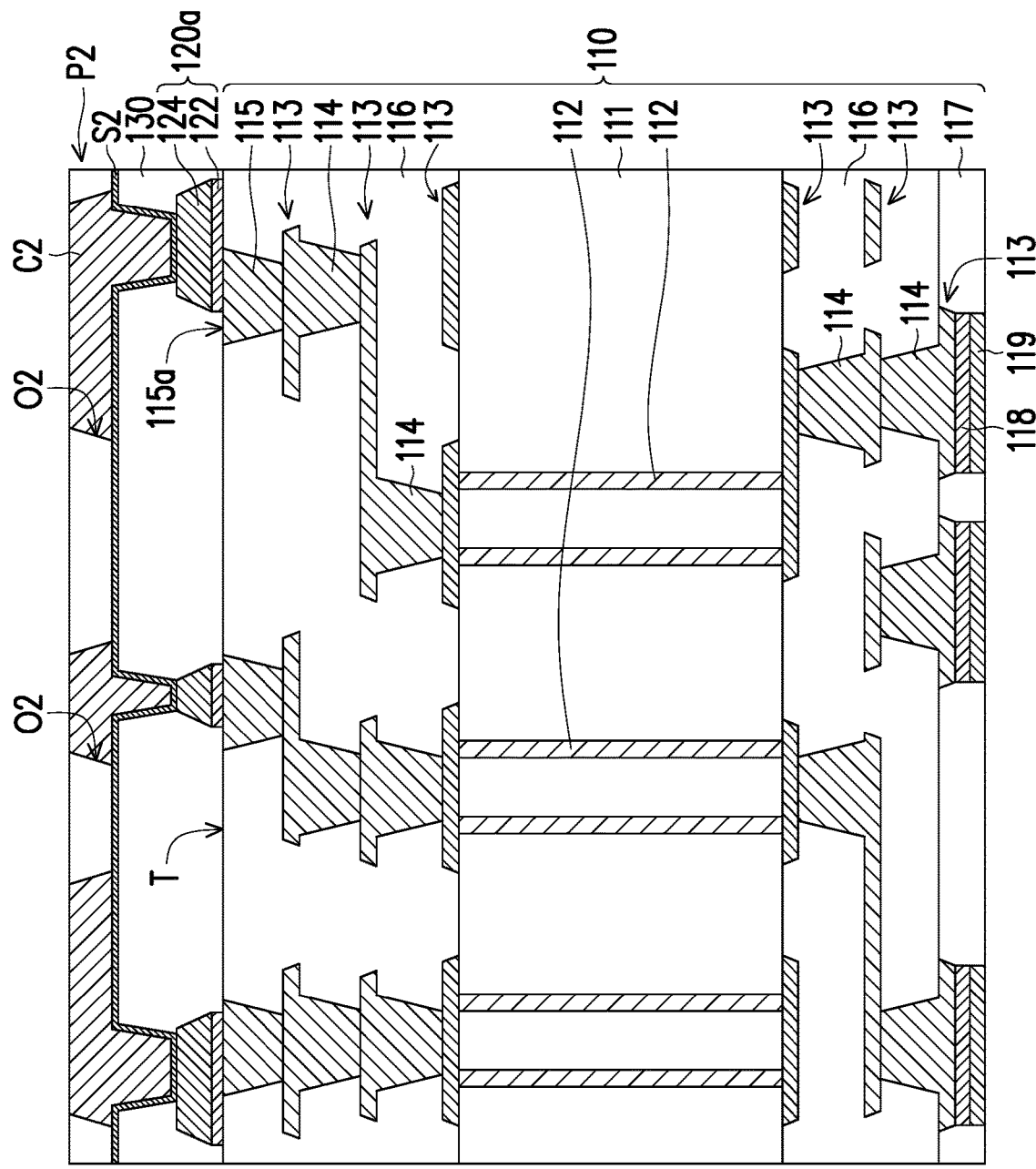
Figure 2L:
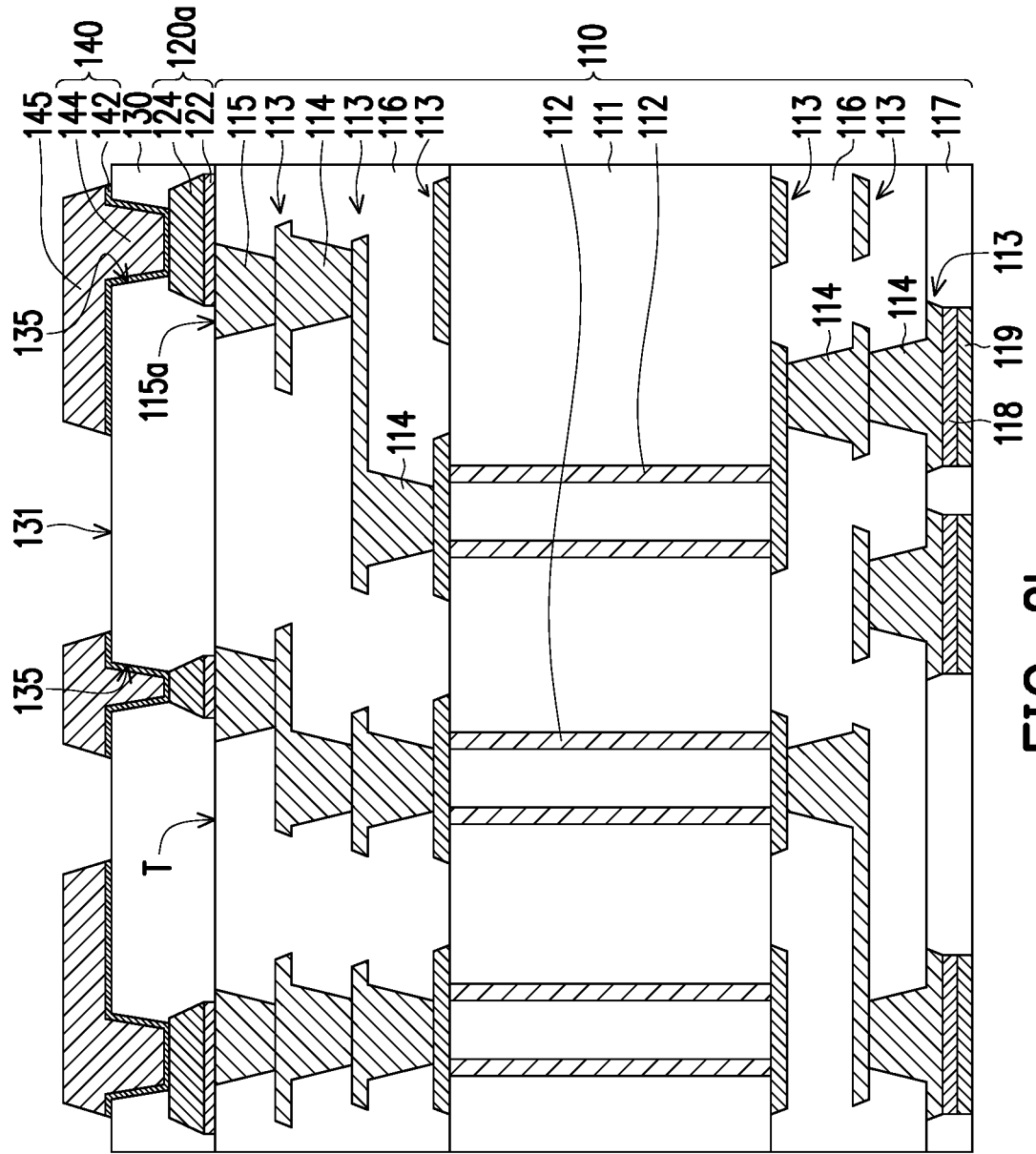
Figure 2M:
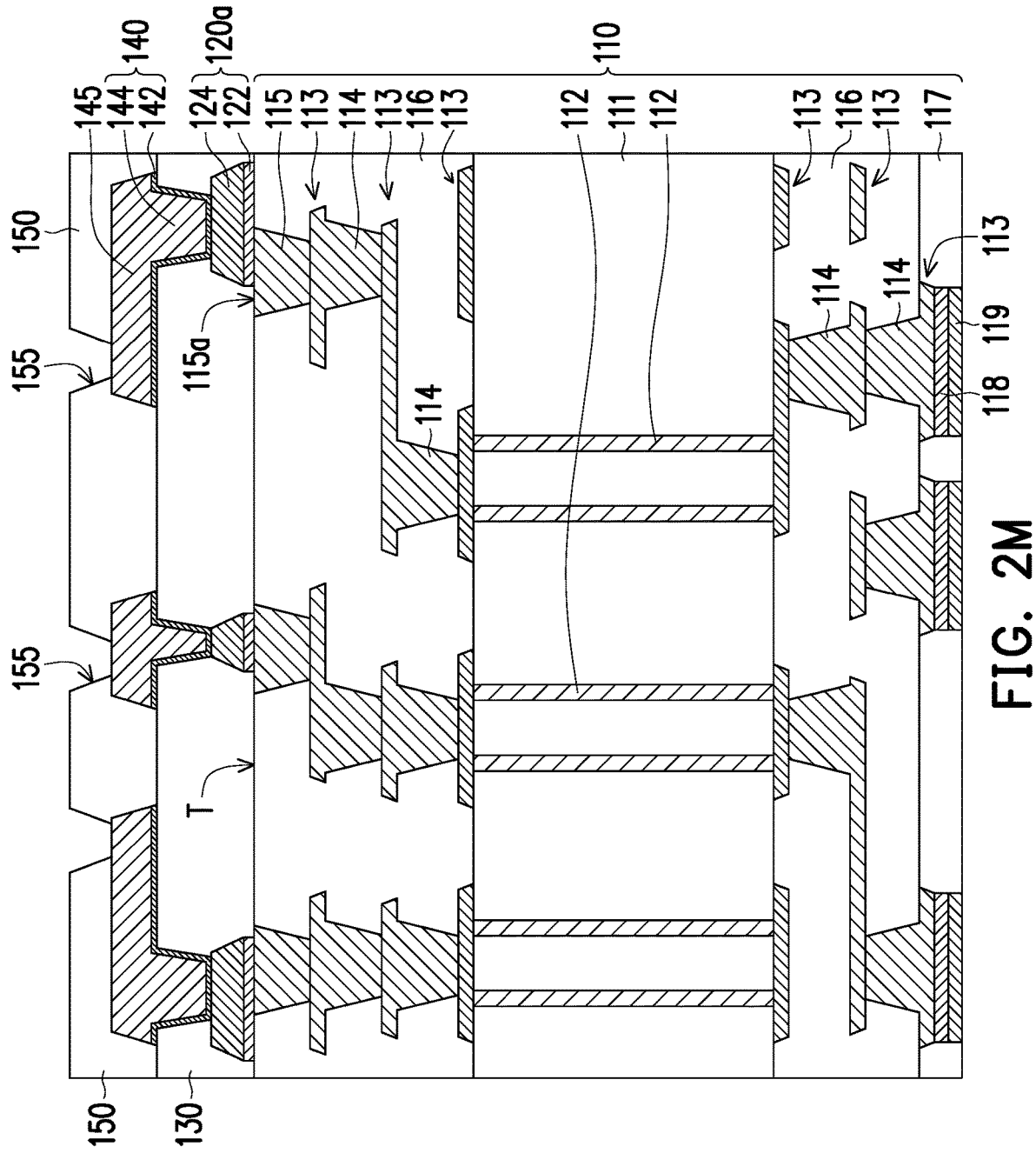
Figure 2N:
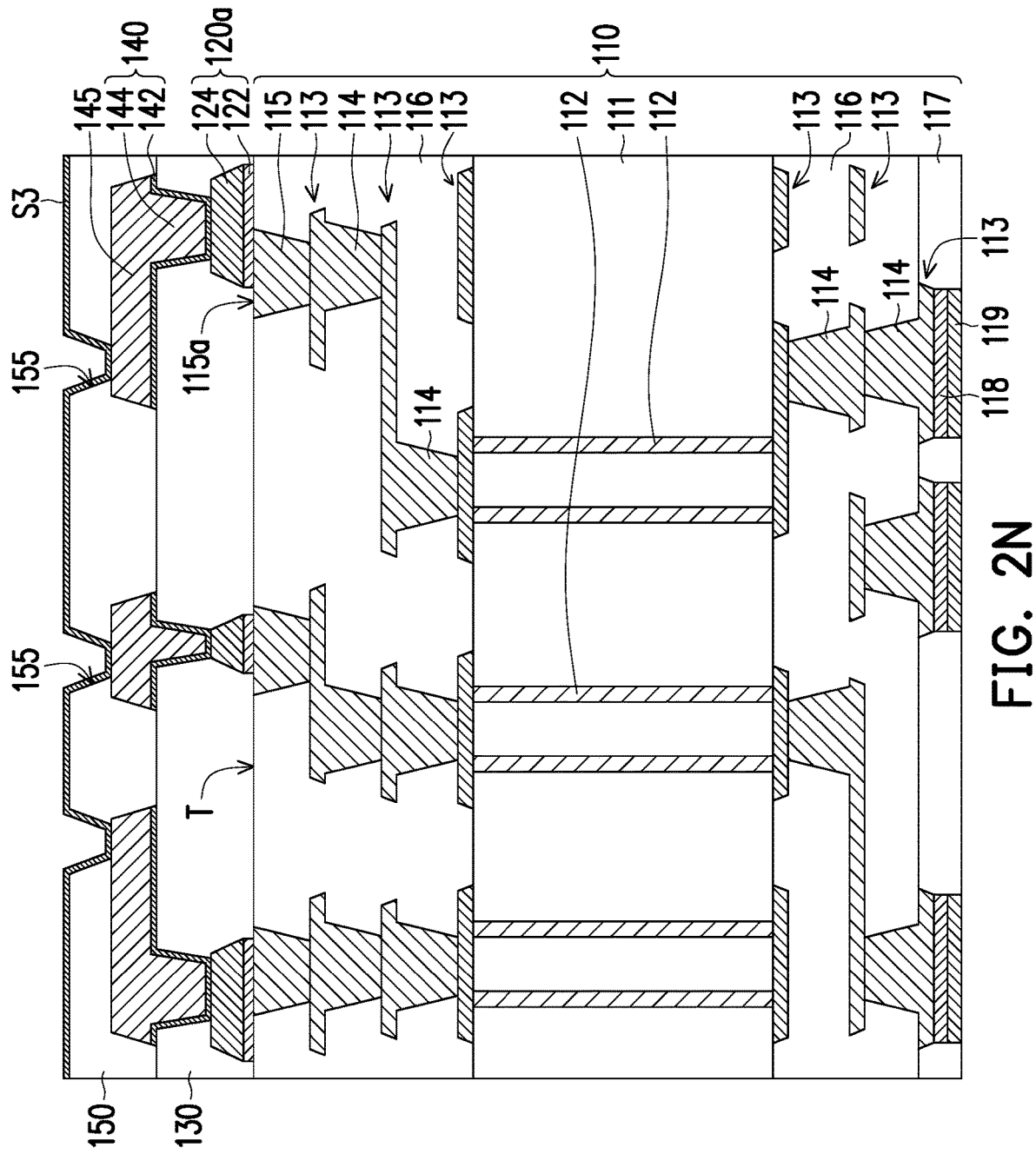
Figure 20:
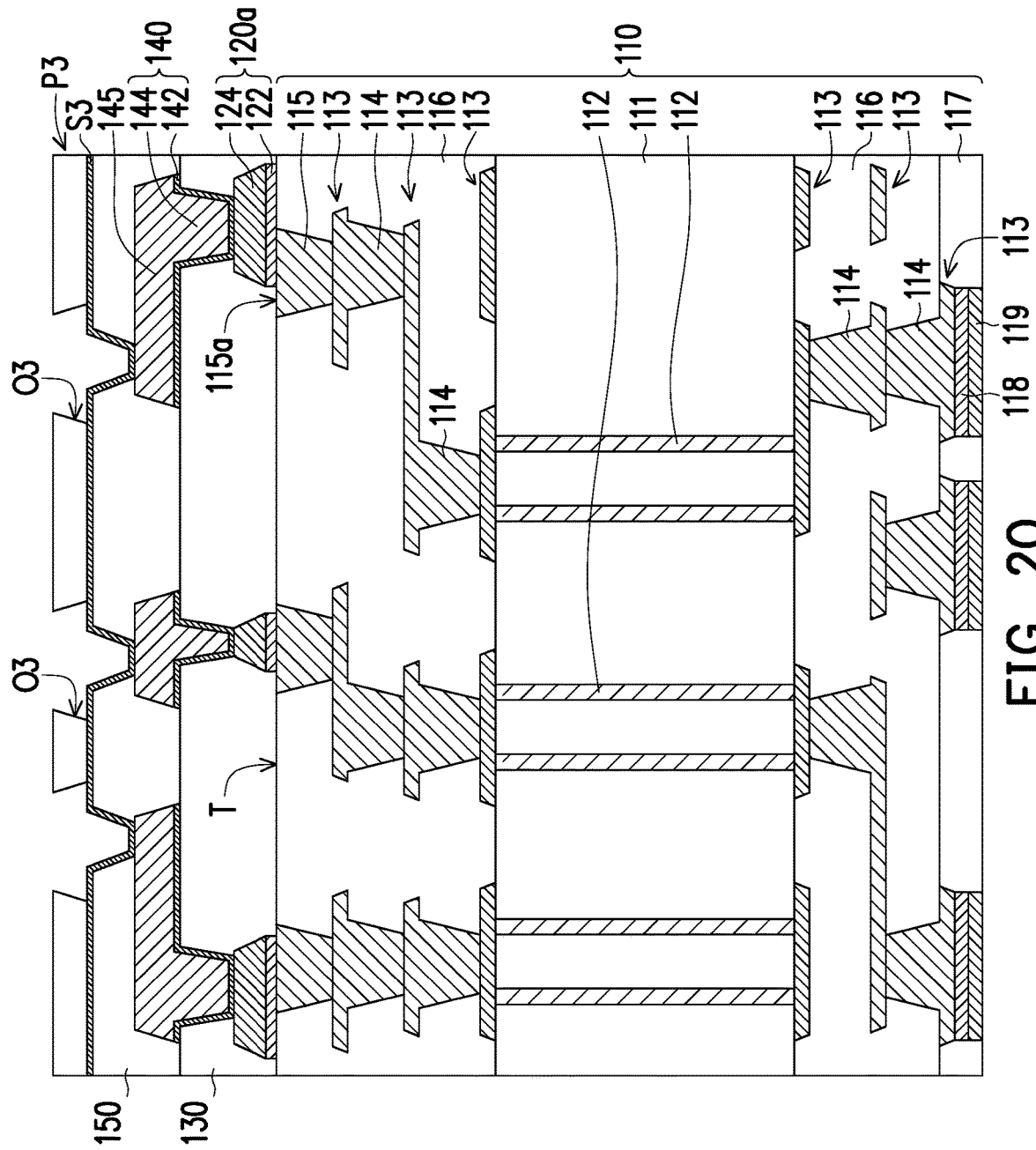
Figure 2P:
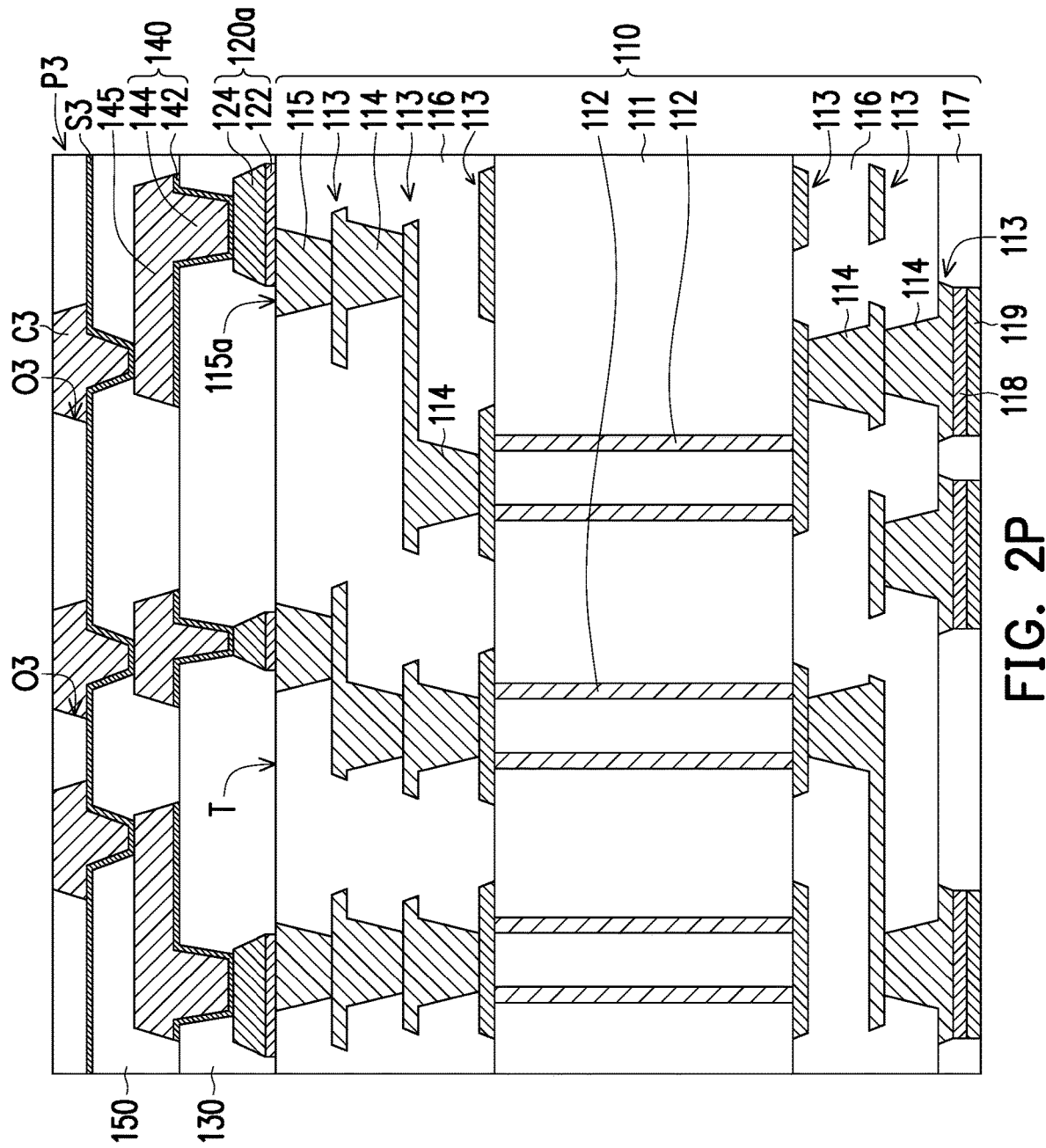
Figure 2Q:
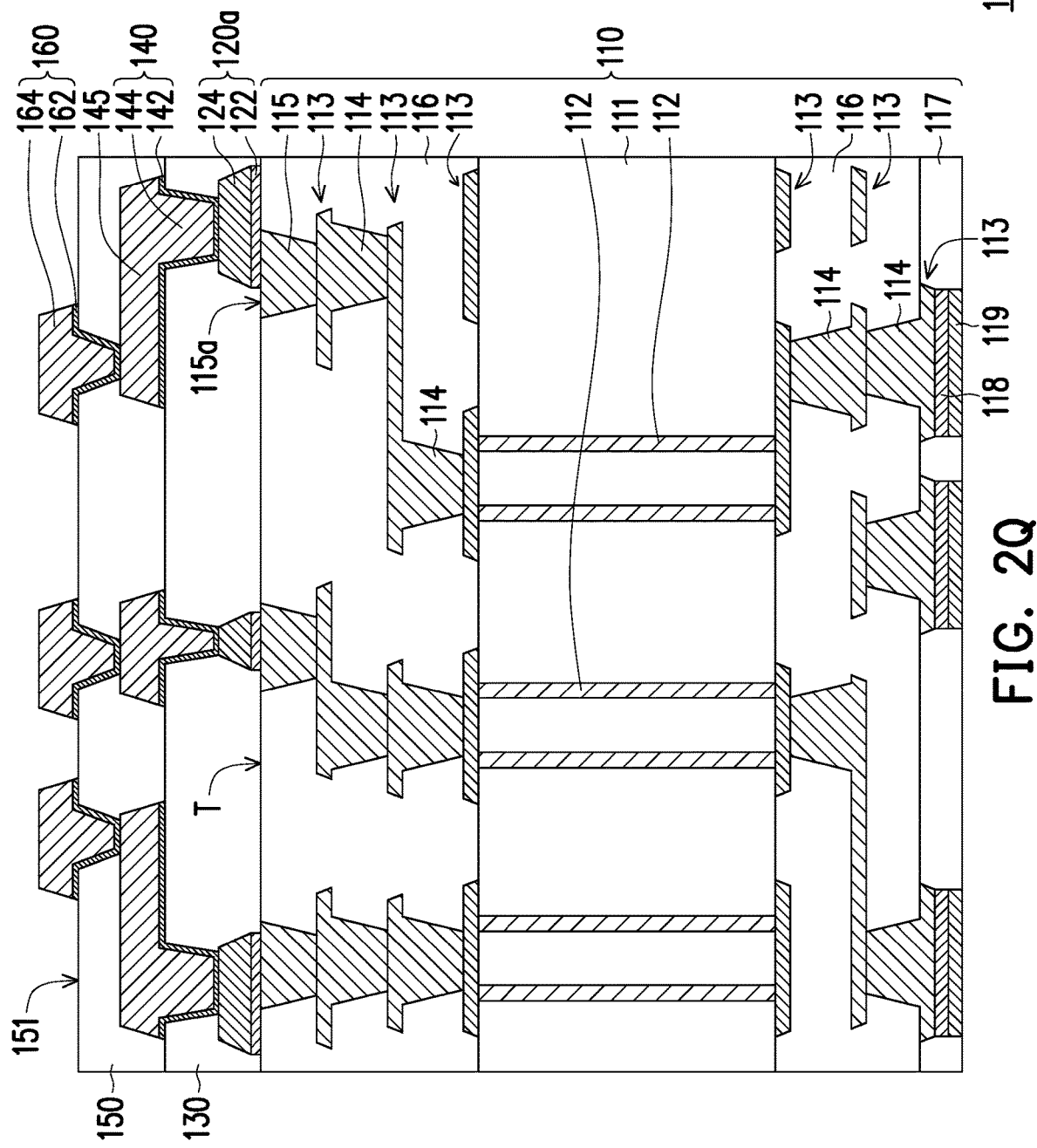

FIG. 2A to FIG. 2Q are schematic cross-sectional views for a manufacturing method of the circuit board structure of FIG. 1A. In the process, first, referring to FIG. 2A, a circuit substrate 110' is provided, and the circuit substrate 110' is a high-density interconnect (HDI) substrate, for example. The circuit substrate 110' includes the core layer 111, multiple conductive vias 112 penetrating the core layer 111 and separated from each other, patterned circuit layers 113 connecting opposite ends of the conductive vias 112 and alternately disposed with multiple layers of the dielectric layers 116, and the conductive structure 114 connecting two adjacent patterned circuit layers. The patterned circuit layer 113, the dielectric layer 116, and the conductive structure 114 may define a build-up circuit structure, which are respectively located on opposite sides of the core layer 111. The opposite sides of the circuit substrate 110 further include copper foil layers M, and the copper foil layers M are disposed on the outermost dielectric layer 116 and cover the outermost conductive structures 114 and 115.

Next, referring to both FIG. 2A and FIG. 2B, an etching process is performed to completely remove the copper foil layer M above the core layer 111, and the outermost dielectric layer 116 and the outermost conductive structure 115 are exposed. The surface 115a of the conductive structure 115 is aligned with the surface T. Meanwhile, the surface T and the surface 115a of the conductive structure 115 may define a connection plane. Meanwhile, the connection surface may be the outermost surface or the upper surface of the circuit substrate 110. Next, a photolithography process is performed on the copper foil layer M under the core layer 111 to form the outermost patterned circuit layer 113 under the core layer 111. Next, the solder mask layer 117 and a surface treatment layer are formed on the outermost patterned circuit layer 113 below the core layer 111. The solder mask layer 117 covers the surface of the dielectric layer 116, the patterned circuit layer 113 is exposed, and the surface treatment layer is disposed on the patterned circuit layer 113 exposed by the solder mask layer 117. Meanwhile, the surface treatment layer includes the first metal layer 118 and the second metal layer 119 disposed on the first metal layer 118. The material of the first metal layer 118 and the material of the second metal layer 119 are, for example, nickel, gold, silver, nickel-palladium-gold, other suitable metals, or alloys, which can protect the patterned circuit layer 113 from oxidizing. Meanwhile, the manufacturing of the ball grid array package surface has been completed, and the ball grid array package surface can be regarded as the outermost surface or the lower surface of the circuit substrate 110. Note that the embodiment does not limit the order of manufacturing the connection surface and the ball grid array package surface. In one embodiment, the ball grid array package surface can also be manufactured first and then the connection surface, which still falls within the scope of the disclosure. At the phase, the manufacturing of the circuit substrate 110 has been completed.

Next, referring to FIG. 2C, a seed layer S1 is sputtered on the surface T of the circuit substrate 110 to cover the surface T of the circuit substrate 110 and the surface 115a of the conductive structure 115. Meanwhile, the seed layer S1 is formed on the connection surface.

Next, referring to FIG. 2D, a patterned photoresist layer P1 is formed on the seed layer S1 by coating a wet film photoresist and by performing a photolithography on the photoresist, the patterned photoresist layer P1 has multiple openings O1, and the openings O1 expose part of the seed layer S1. Meanwhile, the patterned photoresist layer P1 is a wet film photoresist, formed on the seed layer S1 by coating, and then lithographically etched to form the patterned photoresist layer P1.

Next, referring to FIG. 2E, the patterned photoresist layer P1 is used as an electroplating mask to electroplate a conductive material C1 on the seed layer S1, and the conductive material C1 fills the openings O1 and is connected to the seed layer S1.

Next, referring to both FIG. 2E and FIG. 2F, the patterned photoresist layer P1 and part of the seed layer S1 thereunder are removed to form the first circuit layer 120a on the surface T of the circuit substrate 110. Meanwhile, the surface T of the circuit substrate 110 is also exposed, and the first circuit layer 120a is in direct contact with the surface T and structurally and electrically connected to the conductive structure 115. Preferably, the line width L1 (refer to FIG. 1B) of the first circuit layer 120a is less than or equal to ¼ of the line width L2 (refer to FIG. 1B) of the patterned circuit layer 113.

Next, referring to FIG. 2G, the insulating layer 130 is formed by coating to cover the first circuit layer 120a, the surface T of the circuit substrate 110, and the surface 115a of the conductive structure 115.

Next, referring to FIG. 2H, blind vias 135 are formed on the insulating layer 130 by performing the photolithography on the insulating layer 130, and the blind vias 135 expose part of the first circuit layer 120a.

Next, referring to FIG. 2I, a seed layer S2 is sputtered on the insulating layer 130, and the seed layer S2 covers the surface of the insulating layer 130 and the inner wall of the blind via 135.

Next, referring to FIG. 2J, a photoresist layer is coated and undergoes a photolithograph to form a patterned photoresist layer P2 on the seed layer S2. The patterned photoresist layer P2 has multiple openings O2, and the openings O2 expose part of the seed layer S2.

Next, referring to FIG. 2K, the patterned photoresist layer P2 is used as a plating mask to plate a conductive material C2 on the seed layer S2, and the conductive material C2 fills the opening O2 and is connected to the seed layer S2.

Next, referring to both FIG. 2K and FIG. 2L, the patterned photoresist layer P2 and part of the seed layer S2 thereunder are removed to form the second circuit layer 140 in the blind via 135 of the insulating layer 130 and the third circuit layer 145 on the surface 131 of the insulating layer 130. Meanwhile, the second circuit layer 140 is formed on the first circuit layer 120a, and the second circuit layer 140 is in direct contact with the first circuit layer 120a and electrically connected to the first circuit layer 120a.

Next, referring to FIG. 2M, the insulating layer 150 is formed by coating to cover the third circuit layer 145. Blind vias 155 are formed by performing a lithography on the insulating layer 150, and the blind vias 155 expose part of the third circuit layer 145.

Next, referring to FIG. 2N, a seed layer S3 is sputtered on the insulating layer 150, and the seed layer S3 covers the surface of the insulating layer 150 and the inner wall of the blind via 155.

Next, referring to FIG. 2O, a photoresist layer is coated and undergoes a photolithography, and a patterned photoresist layer P3 is formed on the seed layer S3. The patterned photoresist layer P3 has multiple openings O3, and the openings O3 expose part of the seed layer S3.

Then, referring to FIG. 2P, the patterned photoresist layer P3 is used as an electroplating mask to electroplate a conductive material C3 on the seed layer S3, and the conductive material C3 fills the openings O3 and is connected to the seed layer S3.

Finally, referring to both FIG. 2P and FIG. 2Q, the patterned photoresist layer P3 and part of the seed layer S3 thereunder are removed, and the fourth circuit layer 160 including the conductive pattern 164 and the seed layer 162 thereunder is formed in the blind via 155 of the insulating layer 150 and on the surface 151 of the insulating layer 150. At the phase, the manufacturing of the circuit board structure 100a has been completed.

Since the first circuit layer 120a can be directly formed on the surface T of the circuit substrate 110, the manufacturing method of the circuit board structure 100a of the embodiment may have advantages of the reduced number of process layers and the facilitated manufacturing process, an increase of the wiring area and improvement of the production efficiency, and the shortened signal transmission path result in the improvement of the signal integrity.

It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 3:
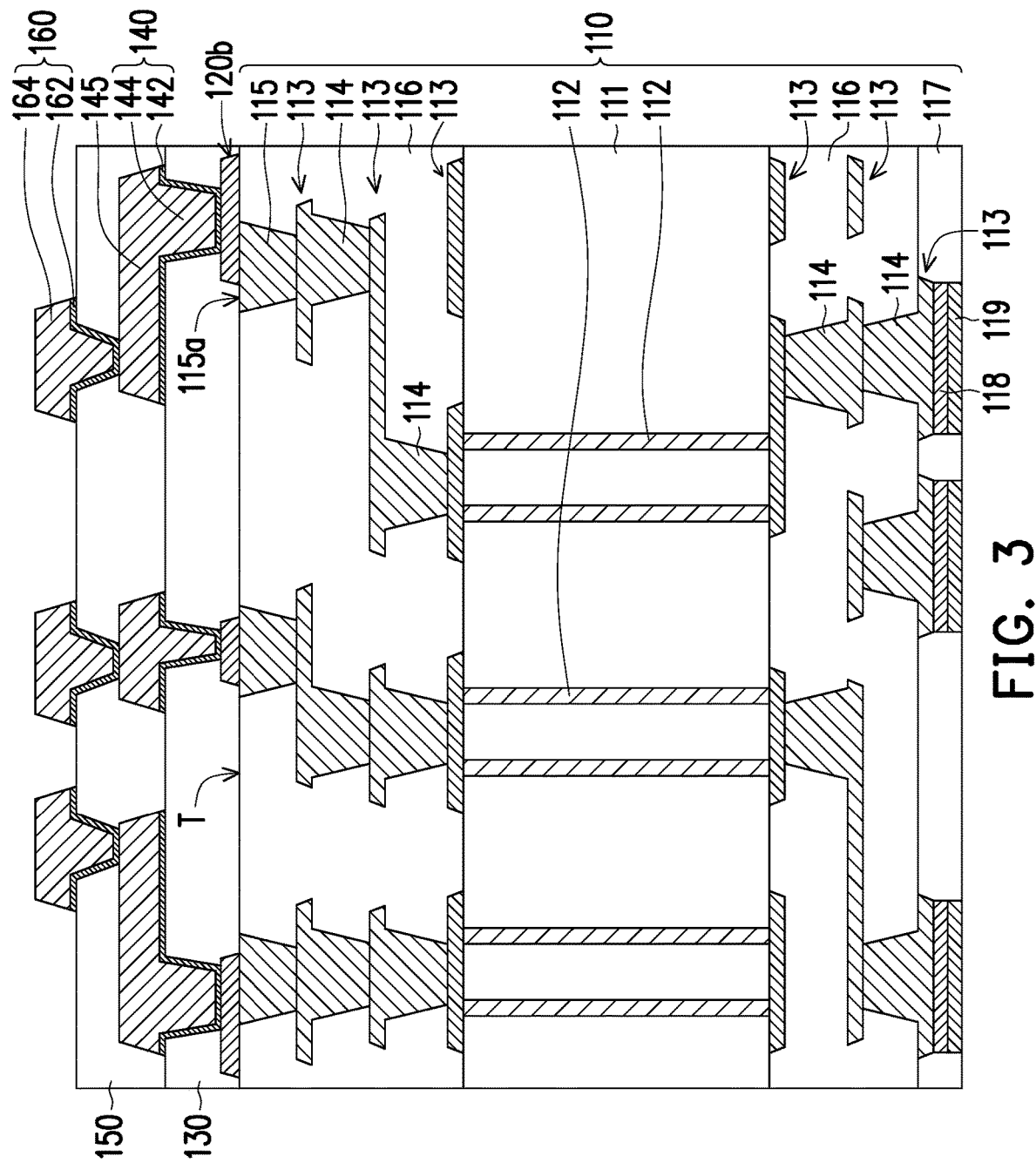
FIG. 3 is a schematic cross-sectional view of a circuit board structure according to another embodiment of the disclosure.
Figure 4A:
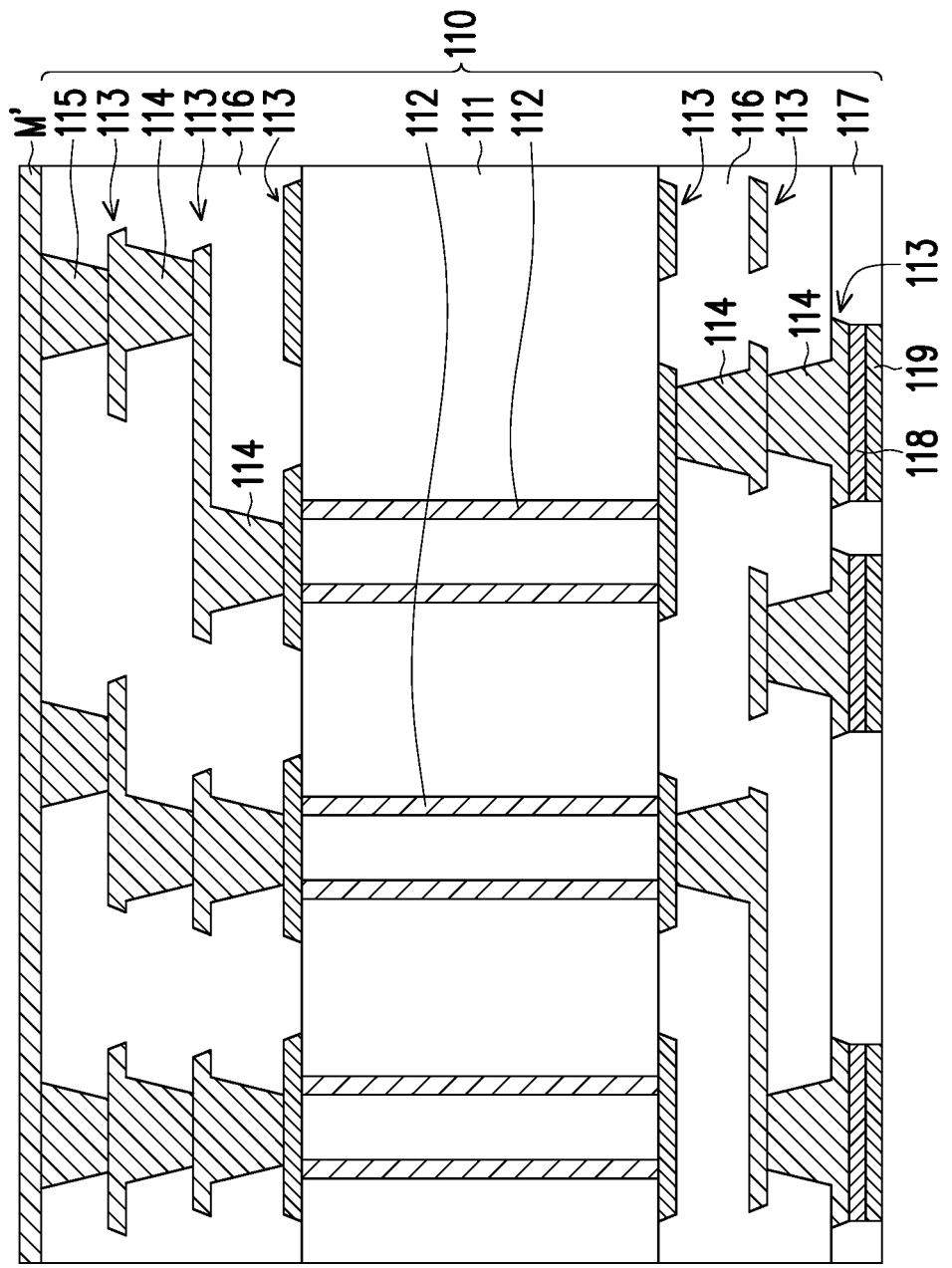
FIG. 4A to FIG. 4D are cross-sectional schematic views for a method of manufacturing the circuit board structure of FIG. 3.
Figure 4B:
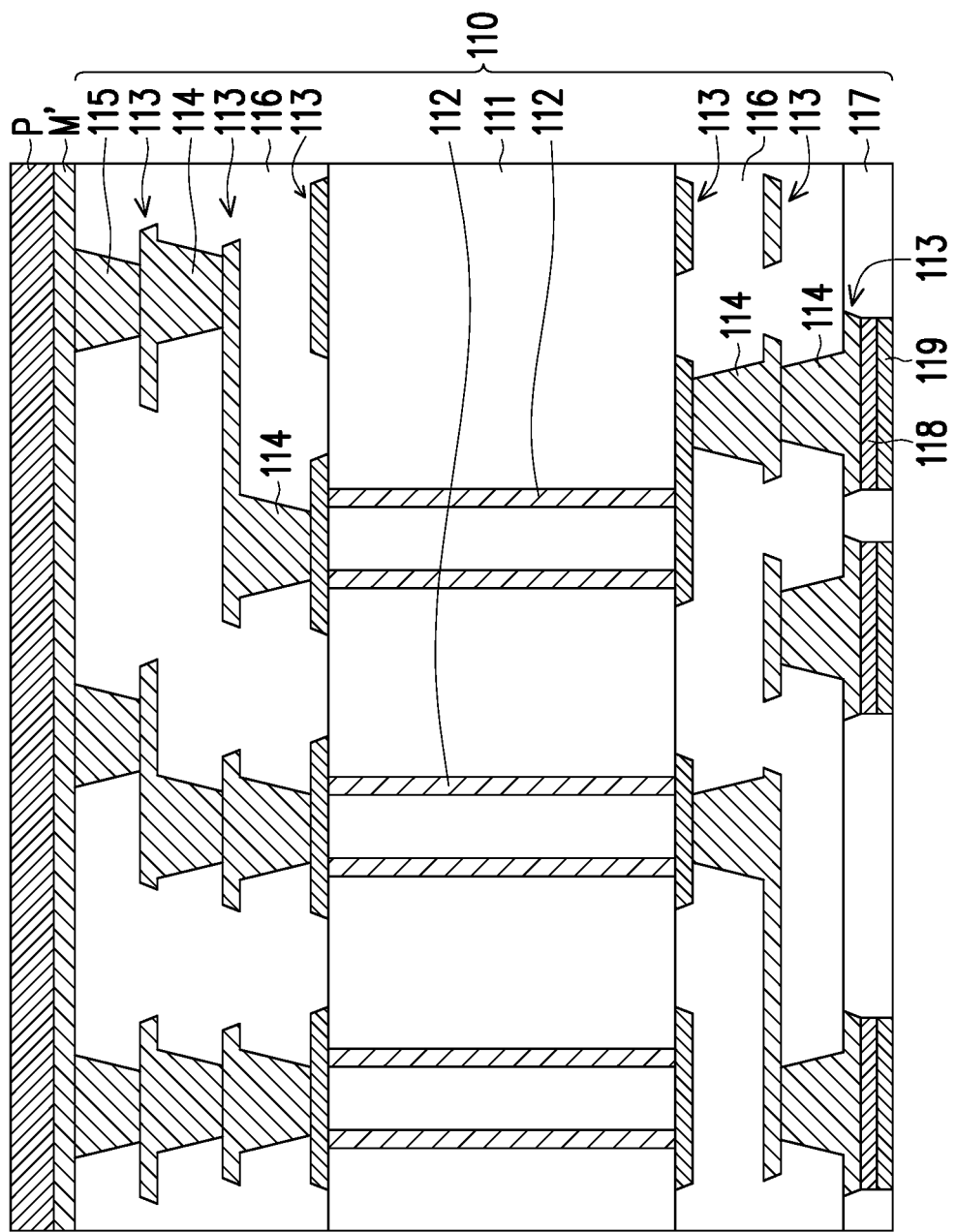
Figure 4C:
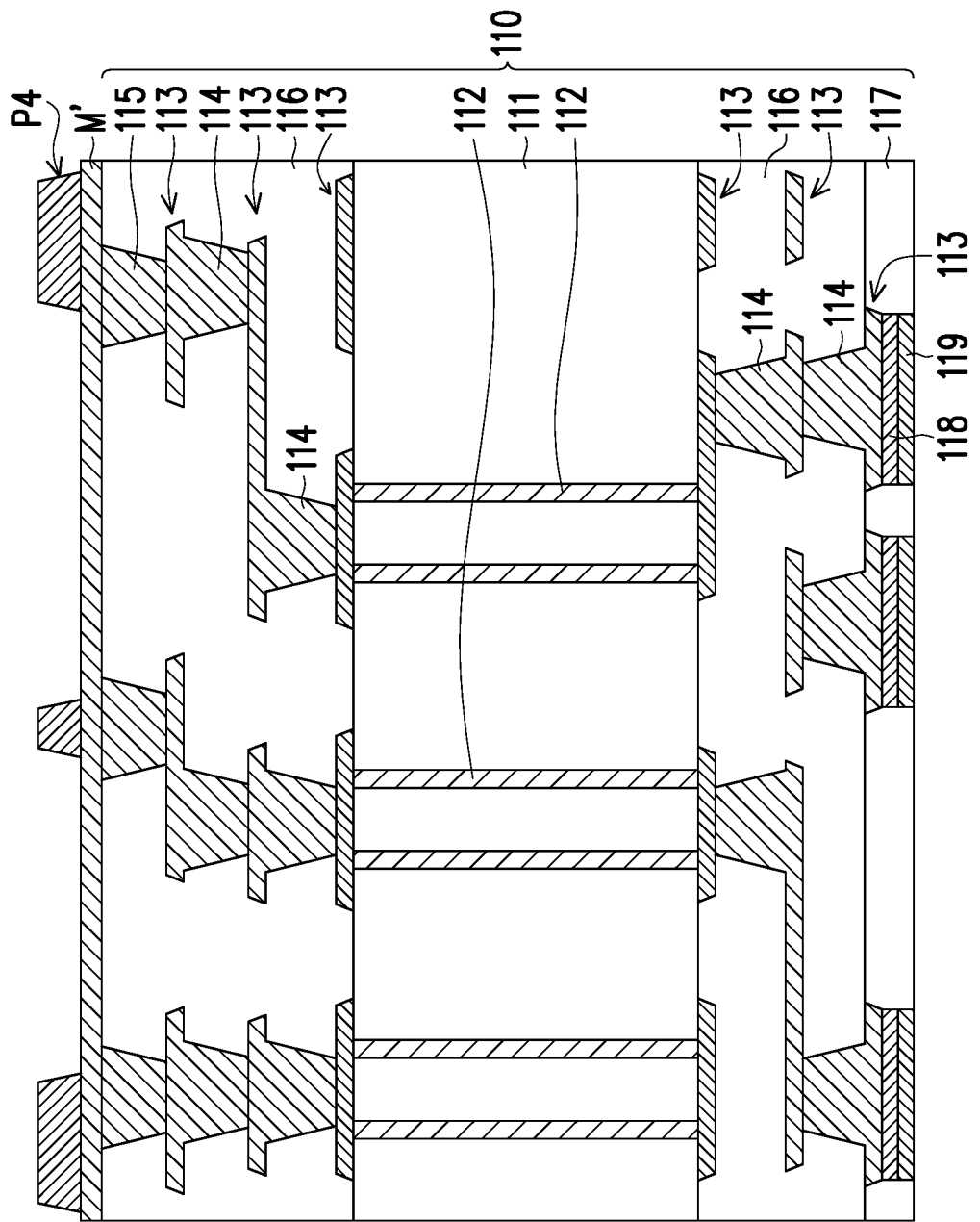
Figure 4D:
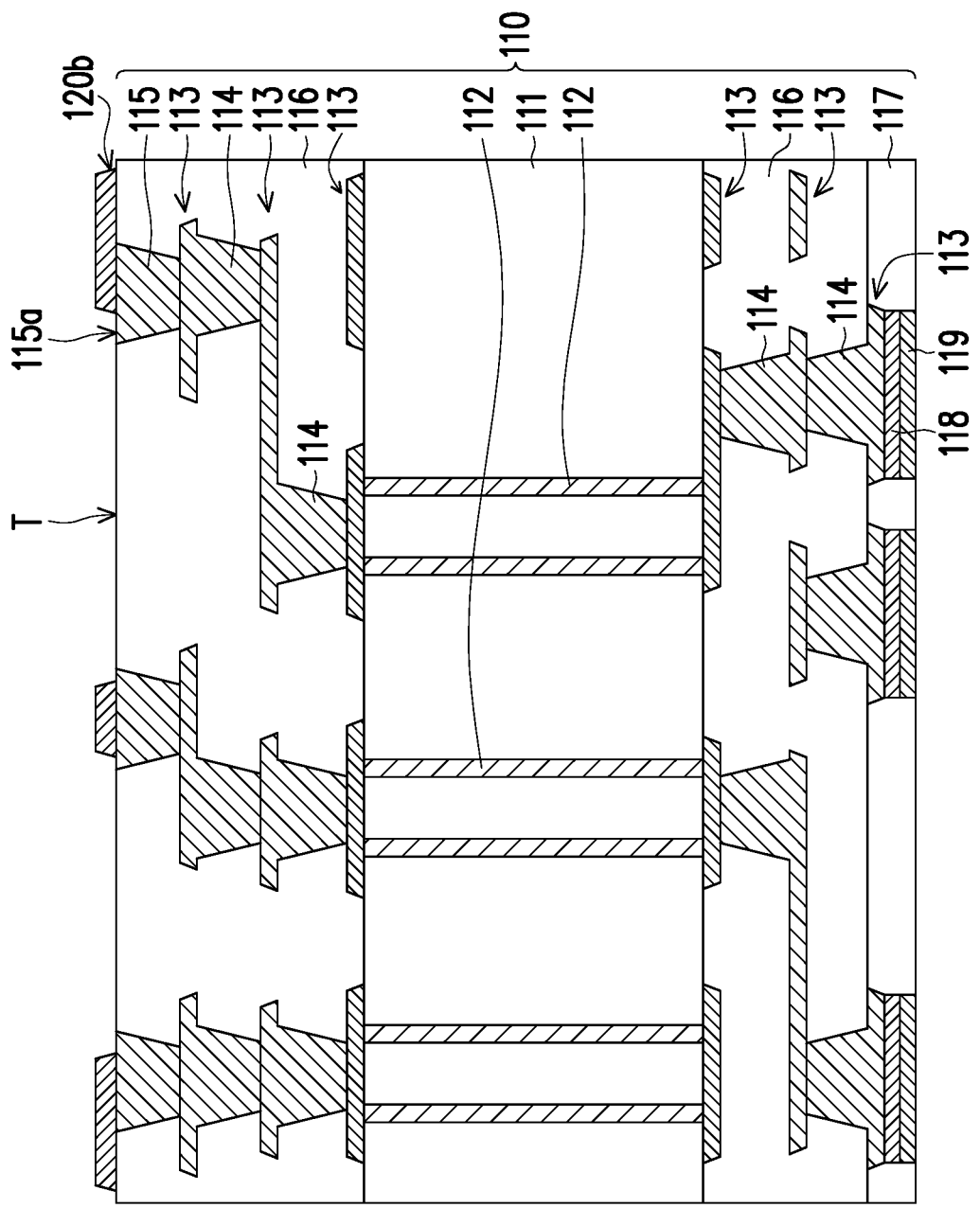

FIG. 3 is a schematic cross-sectional view of a circuit board structure according to another embodiment of the disclosure. Referring to both FIG. 1A and FIG. 3, a circuit board structure 100b of the embodiment is similar to the circuit board structure 100a of FIG. 1A. What differs is that the first circuit layer 120b of the embodiment is a single-layer structure, and its material is copper foil, for example, but it is not limited thereto.

FIG. 4A to FIG. 4D are cross-sectional schematic views for a method of manufacturing the circuit board structure of FIG. 3. In the manufacturing process, after the step in FIG. 2A, referring to FIG. 4A, the ball grid array package surface under the core layer 111 can be selectively manufactured first, and then the copper foil layer M over the core layer 111 undergoes a thinned procedure to form a copper thin layer M'. Next, referring to FIG. 4B, a photoresist layer P is formed on the copper thin layer M' by coating. Meanwhile, the photoresist layer P is a wet film photoresist, which is adapted for manufacturing thin lines and has better resolution. Next, referring to FIG. 4C, a patterned photoresist layer P4 is formed on the copper foil layer M' by performing a photolithography on the photoresist layer P. Subsequently, referring to both FIG. 4C and FIG. 4D, the copper foil layer M' exposed outside the patterned photoresist layer P4 is etched to expose part of the surface T of the circuit substrate 110. Next, the patterned photoresist layer P4 is removed to form a first circuit layer 120b on the surface T of the circuit substrate 110. Finally, by following up the steps of FIG. 2G to FIG. 2Q, the circuit board structure 100b of FIG. 3 can be completed. In short, in the embodiment, the first circuit layer 120b is formed by etching the copper thin layer M' on the circuit substrate 110'.

Figure 5:
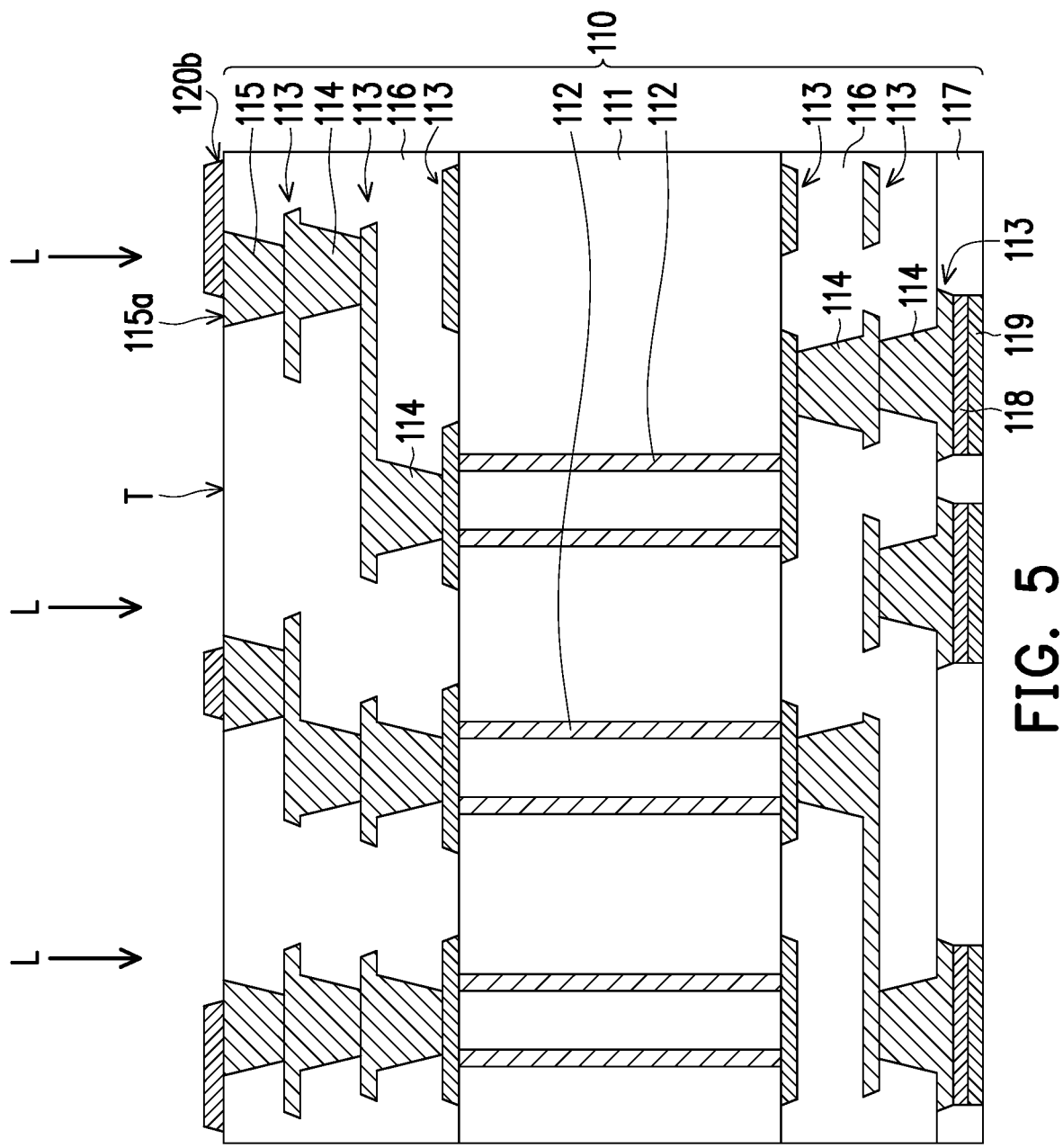
FIG. 5 is a partial schematic cross-sectional view for another manufacturing method of the circuit board structure of FIG. 3.

FIG. 5 is a partial schematic cross-sectional view for another manufacturing method of the circuit board structure of FIG. 3. In the manufacturing process, after the step in FIG. 4A, referring to FIG. 5, a laser process is performed on the copper foil layer M', and the copper foil layer M' is lasered by laser light L to form the first circuit layer 120b on the surface T of the circuit substrate 110. Afterwards, and finally, by following up the steps of FIG. 2G to FIG. 2Q, the circuit board structure 100b of FIG. 3 can be completed. In short, in the embodiment, the first circuit layer 120b is formed by performing laser engraving on the copper thin layer M' on the circuit substrate 110'.

In summary, in the design of the circuit board structure of the disclosure, the first circuit layer is directly disposed on the surface of the circuit substrate and electrically connected to the conductive structure of the circuit substrate, and the line width of the first circuit layer is less than or equal to ¼ of the line width of the patterned circuit layers of the circuit substrate. That is, in the circuit board structure of the disclosure, without configuring the transfer layer in the prior art, a first circuit layer with a thin line width can be directly formed on the circuit substrate, which can effectively shorten the signal transmission path and has favorable signal integrity.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A circuit board structure comprising:
    a circuit substrate comprising a surface and at least one conductive structure and at least one patterned circuit layer, wherein the at least one conductive structure is electrically connected to the at least one patterned circuit layer, and an upper surface of the at least one conductive structure is aligned with the surface;
    a first circuit layer directly disposed on the surface of the circuit substrate and electrically connected to the at least one conductive structure, wherein a line width of the first circuit layer is less than or equal to ¼ of a line width of the at least one patterned circuit, wherein the first circuit layer comprises at least one circuit, and the at least one circuit has an aspect ratio as a thickness of the at least one circuit over its line width greater than or equal to 2.5; and
    a second circuit layer directly disposed on the first circuit layer and electrically connected to the first circuit layer.

2. The circuit board structure of claim 1, wherein the circuit substrate comprises a high-density interconnect substrate.

3. The circuit board structure of claim 1, wherein the line width and line spacing of the at least one circuit are respectively less than or equal to 10 microns.

4. The circuit board structure of claim 1, wherein the first circuit layer comprises at least one pad, and a diameter of the at least one pad is less than or equal to ⅕ of a diameter of the at least one conductive structure.

* * * * *